United States Patent
Shin et al.

(10) Patent No.: US 10,879,898 B2
(45) Date of Patent: Dec. 29, 2020

(54) POWER GATING CIRCUIT FOR HOLDING DATA IN LOGIC BLOCK

(71) Applicant: Samsung Electronics Co., Ltd., Suwon-si (KR)

(72) Inventors: Insub Shin, Suwon-si (KR); Wook Kim, Yongin-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/249,129

(22) Filed: Jan. 16, 2019

(65) Prior Publication Data

US 2019/0229731 A1 Jul. 25, 2019

(30) Foreign Application Priority Data

Jan. 23, 2018 (KR) .................. 10-2018-0008136
Jun. 7, 2018 (KR) .................. 10-2018-0065533

(51) Int. Cl.
*H03K 3/012* (2006.01)
*H03K 19/00* (2006.01)
*H03K 17/30* (2006.01)

(52) U.S. Cl.
CPC ......... *H03K 19/0013* (2013.01); *H03K 3/012* (2013.01); *H03K 17/302* (2013.01); *H03K 19/0016* (2013.01)

(58) Field of Classification Search
CPC .................. H03K 19/0013; H03K 19/0016
USPC .................................. 327/142, 143
See application file for complete search history.

(56) References Cited

U.S. PATENT DOCUMENTS

| | | | |
|---|---|---|---|
| 4,868,483 | A | 9/1989 | Tsujimoto |
| 6,166,985 | A | 12/2000 | McDaniel et al. |
| 7,479,801 | B2 | 1/2009 | Bhattacharya |
| 7,643,368 | B2 | 1/2010 | Choi et al. |
| 8,134,874 | B2 | 3/2012 | Shiu et al. |
| 8,138,795 | B2 | 3/2012 | Hseih et al. |
| 8,305,829 | B2 | 11/2012 | Chan et al. |
| 8,395,440 | B2 | 3/2013 | Sandhu et al. |
| 8,605,180 | B2 | 12/2013 | Shimizu |
| 8,736,314 | B2 | 5/2014 | Kim |

(Continued)

OTHER PUBLICATIONS

Pedroni, V.A., "Low-Voltage High-Speed Schmitt Trigger and Compact Window Comparator", Electronics Letters vol. 41 No. 22, IEEE, Oct. 27, 2005 (Year: 2005).*

(Continued)

*Primary Examiner* — Tomi Skibinski
(74) *Attorney, Agent, or Firm* — Harness, Dickey & Pierce, P.L.C.

(57) ABSTRACT

A power gating circuit includes a first switch circuit, a gate circuit, and a second switch circuit. The first switch circuit is configured to disconnect a first voltage line from a second voltage line while a logic block connected to the first voltage line is in a first operation state. The gate circuit is configured to output a control signal having a first logical value if a level of a first voltage on the first voltage line is lower than a reference level while the logic block is in the first operation state. The second switch circuit configured to connect the first voltage line to the second voltage line based on the first logical value of the control signal. The reference level is based on a type of a logic gate included in the gate circuit.

20 Claims, 16 Drawing Sheets

(56) References Cited

U.S. PATENT DOCUMENTS

| | | | |
|---|---|---|---|
| 8,823,445 B2 | 9/2014 | Choy et al. | |
| 9,871,507 B1 | 1/2018 | Zyuban et al. | |
| 2008/0272652 A1* | 11/2008 | Idgunji | H03K 19/0016 307/38 |
| 2016/0202714 A1 | 7/2016 | Luria et al. | |

OTHER PUBLICATIONS

"CMOS Inverter", 2013, Institute of Microelectronic Systems, http://www.csit-sun.pub.ro/courses/vlsi/VLSI_Darmstad/www.microelectronic.e-technik.tu-darmstadt.de/lectures/winter/vlsi/vorlesung_pdf/chap05.pdf (Year: 2013).*

"The CMOS Inverter", 1999, http://bwrcs.eecs.berkeley.edu/Classes/icdesign/ee141_f01/Notes/chapter5.pdf (Year: 1999).*

Kim, S. et al., "Experimental Measurement of a Novel Power Gating Structure with Intermediate Power Saving Mode," Proceedings of the 2004 Internatoinal Symposium on Low Power Electronics Design, (ISLPED'04), pp. 20-25.

Agarwal, K. et al., "Power Gating with Multiple Sleep Modes," Proceedings of the 7th International Symposium on Quality Electronic Design (ISQED'06).

Pakbaznia, E. et al., "Design and Application of Multimodal Power Gating Structures," 10th Int'l Symposium on Quality Electronic Design, 2009 IEEE.

\* cited by examiner

POWER GATING CIRCUIT FOR HOLDING DATA IN LOGIC BLOCK

CROSS-REFERENCE TO RELATED APPLICATIONS

This application claims priority under 35 U.S.C. § 119 to Korean Patent Application Nos. 10-2018-0008136 filed on Jan. 23, 2018, and 10-2018-0065533 filed on Jun. 7, 2018, in the Korean Intellectual Property Office, the disclosures of which are incorporated by reference herein in their entireties.

BACKGROUND

1. Field

Example embodiments of the inventive concepts described herein relate to an electronic circuit, and more particularly, relate to configurations and operations of a power gating circuit including a power switch.

2. Description of the Related Art

Nowadays, the miniaturization and portability of electronic devices is being accentuated. Concurrently, functions to be performed in an electronic device increase in number. Most small-sized electronic devices operate based on a power from a battery. Accordingly, there is a need to reduce power consumption of an electronic device for the purpose of performing more functions in the electronic device.

SUMMARY

A power gating technique may be used to reduce power consumption in an electronic device. The power gating technique may allow for an operation voltage that is lower when some components included in the electronic device are not operating. Accordingly, a leakage current of the logic block and power consumption of the electronic device may decrease.

The example embodiments provide a power gating circuit for maintaining data. In some example embodiments, the power gating circuit may include a first switch circuit, a gate circuit, and a second switch circuit. The first switch circuit is configured to disconnect a first voltage line from a second voltage line while a logic block connected to the first voltage line is in a first operation state. The gate circuit is configured to output a control signal having a first logical value if a level of a first voltage on the first voltage line is lower than a reference level while the logic block is in the first operation state. The second switch circuit configured to connect the first voltage line to the second voltage line based on the first logical value of the control signal. The reference level is based on a type of a logic gate included in the gate circuit.

The example embodiments provide another power gating circuit for maintaining data. In some example embodiments, the power gating circuit includes a gate circuit, and a first switch circuit. The gate circuit is configured to output a control signal selectively having a first logical value or a second logical value based on (i) a level of a first voltage on a first voltage line connected to a logic block and (ii) a first reference level, in a first mode. The first switch is circuit configured to disconnect the first voltage line from a second voltage line based on the first logical value of the control signal and connect the first voltage line to the second voltage line based on the second logical value of the control signal, in the first mode. The gate circuit is configured such that the first reference level changes based on a type of a logic gate included in the gate circuit and a level of a second voltage on the second voltage line.

The example embodiments provide yet another power gating circuit for maintaining data. In some example embodiments, the power gating circuit includes a control circuit and a switch circuit. The control circuit is configured to output a control signal without receiving any other voltage except for a first voltage, a second voltage and a third voltage. The first voltage is of a first voltage line connected to a logic block. The second voltage is of a second voltage line. The second voltage has a lower level than a level of the first voltage. The third voltage is of a third voltage line. The third voltage has a higher level than the level of the first voltage. The switch circuit is configured to connect the first voltage line to the third voltage line or disconnect the first voltage line from the third voltage line, based on the control signal, such that the level of the first voltage is higher than a first reference level, while the logic block is in a maintaining state. The logic block is further configured to retain data stored in the logic block without a data input and output, based on the level of the first voltage, which is higher than the first reference level in the maintaining state.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, example embodiments of the inventive concepts are described in clear detail such that a person having ordinary skill in the art may easily implements the inventive concepts.

Figure 1:
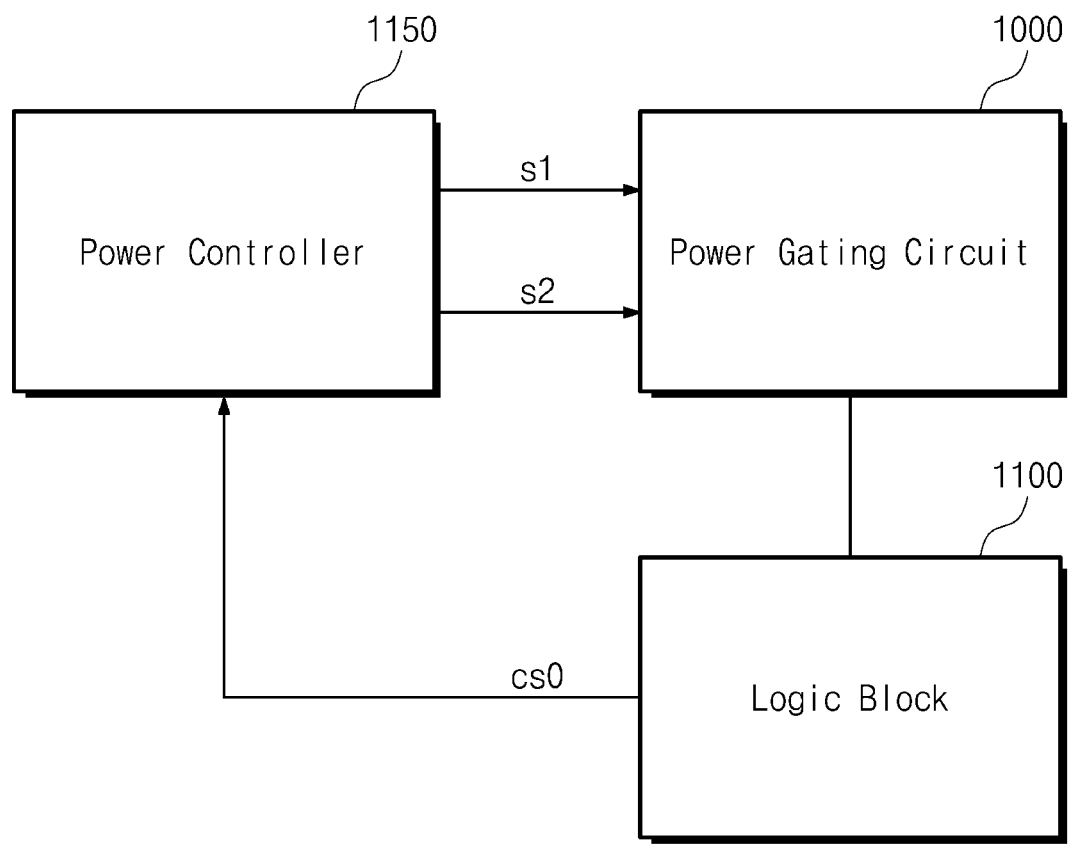
FIG. 1 is a block diagram illustrating an example configuration associated with a power gating circuit according to an example embodiment of the inventive concepts.

FIG. 1 is a block diagram illustrating an example configuration associated with a power gating circuit according to an example embodiment of the inventive concepts.

A logic block 1100 may implement all or a part of functions which may be implemented by an electronic device including the logic block 1100. For example, an electronic device may include at least one of a desktop personal computer (PC), a notebook, a tablet, a smartphone, a wearable device, a server, and an electric vehicle. For example, the logic block 1100 may implement all or a part of functions associated with a graphic processing unit (GPU), a modulator/demodulator (MODEM), a memory device, etc.

The logic block 1100 may operate to implement a function. For example, the logic block 1100 may receive data from the outside or may output data to the outside. The logic block 1100 may store the input data.

A power controller 1150 may receive an operation signal from an external device. For example, the power controller 1150 may include a power management unit (PMU). For example, the external device may include a main processor (e.g., a central processing unit (CPU) or an application processor (AP)) or a separate voltage control circuit. In the case where data are input to the logic block 1100 or the logic block 1100 outputs data to the external device, the operation signal may be received from the external device.

An operation state of the logic block 1100 may be determined by the operation signal. For example, the power controller 1150 may generate power signals s1 and s2 associated with the operation state of the logic block 1100, based on the operation signal.

Each of the power signals s1 and s2 may selectively have a value of logic "0" or a value of logic "1", based on the operation signal. Each of the power signals s1 and s2 may selectively have a voltage level corresponding to a logical value. For example, the power signal s1 having a value of logic "1" may have a first voltage level. The power signal s2 having a value of logic "0" may have a second voltage level.

A power gating circuit 1000 may receive the power signals s1 and s2. The power gating circuit 1000 may control an operation state of the logic block 1100 based on the power signals s1 and s2.

For example, in the case where a first operation signal is not received during a first time, the power controller 1150 may generate the power signals s1 and s2 each having the value of logic "1". The power gating circuit 1000 may control the logic block 1100 based on the power signals s1 and s2 such that the operation state of the logic block 1100 is changed from a first operation state (hereinafter referred to as a "full operation state") to a second operation state (hereinafter referred to as a "maintaining state"). In the case where the first operation signal is not received during a second time, the power controller 1150 may generate the power signal s1 having the value of logic "1" and the power signal s2 having the value of logic "0". The power gating circuit 1000 may control the logic block 1100 based on the power signals s1 and s2 such that the operation state of the logic block 1100 is changed from the maintaining state to a third operation state (hereinafter referred to as a "non-operation state"). For another example, in the case where a second operation signal is received, the power controller 1150 may generate the power signal s1 having the value of logic "1" and the power signal s2 having the value of logic "0". The power gating circuit 1000 may control the logic block 1100 based on the power signals s1 and s2 such that the operation state of the logic block 1100 is changed from the full operation state to the non-operation state.

The logic block 1100 may operate in various operation states under control of the power gating circuit 1000. For example, in the case where the logic block 1100 is in the full operation state, the logic block 1100 may operate to implement a function. In the full operation state, the logic block 1100 may receive data. The logic block 1100 may store the input data. Also, in the full operation state, the logic block 1100 may output data received from the outside or data generated through an internal operation of the logic block 1100 to the outside.

For example, in the case where the logic block 1100 is in the maintaining state, the logic block 1100 may stop a part of operations which the logic block 1100 performs in the full operation state. In the maintaining state, the logic block 1100 may retain the stored data without receiving data or outputting data.

For example, in the case where the logic block 1100 is in the non-operation state, the logic block 1100 may not operate. In the non-operation state, the logic block 1100 may lose the data stored in the full operation state.

However, the inventive concepts are not limited thereto. For example, the power controller 1150 may receive a signal cs0 from the logic block 1100. The power controller 1150 may generate the power signals s1 and s2 based on the signal cs0. However, since an operation of the power gating circuit 1000 receiving the power signals s1 and s2 which depend on the signal cs0 corresponds to an operation of the power gating circuit 1000 receiving the power signals s1 and s2 which depend on an operation signal, the case where the power signals s1 and s2 are generated based on the signal cs0 may be omitted in the following descriptions.

Figure 2:
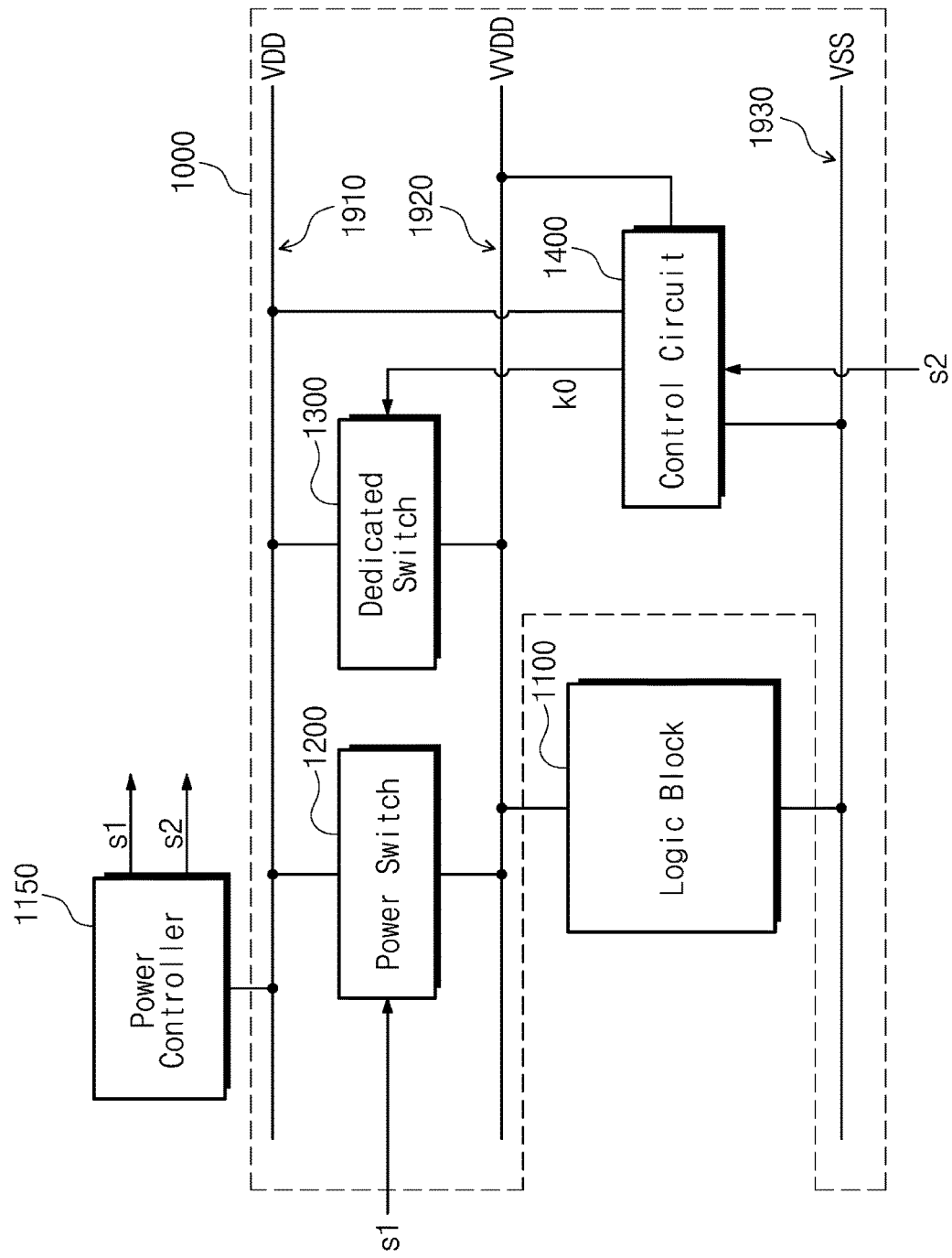
FIG. 2 is a block diagram illustrating an example configuration of a power gating circuit of FIG. 1.

FIG. 2 is a block diagram illustrating an example configuration of a power gating circuit of FIG. 1.

The power gating circuit 1000 may include a power switch circuit 1200, a dedicated switch circuit 1300, a control circuit 1400, a power supply voltage line 1910, an operation voltage line 1920, and a ground voltage line 1930.

The power supply voltage line 1910 may be supplied with a voltage from the outside of an electronic device or may be supplied with a voltage from a battery included in the electronic device. The power supply voltage line 1910 may supply a power supply voltage VDD to components positioned within the electronic device.

The operation voltage line 1920 may be supplied with a voltage from the power supply voltage line 1910. The operation voltage line 1920 may supply an operation voltage VVDD to the components positioned within the electronic device. A level of the operation voltage VVDD may be lower than a level of the power supply voltage VDD or may be substantially identical to the level of the power supply voltage VDD.

The ground voltage line 1930 may supply a ground voltage VSS. For example, the ground voltage VSS may provide a reference potential for the levels of the voltages VVDD and VDD. A level of the ground voltage VSS may be lower than a level of the operation voltage VVDD or may be substantially identical to the level of the operation voltage VVDD.

The power switch circuit 1200 may be connected to the power supply voltage line 1910 and the operation voltage line 1920. The power switch circuit 1200 may receive the power signal s1. Depending on the power signal s1, the power switch circuit 1200 may connect the operation voltage line 1920 to the power supply voltage line 1910 or may disconnect the operation voltage line 1920 from the power supply voltage line 1910. The connection or disconnection may be an electrical connection and electrical disconnection, respectively.

The control circuit 1400 may be connected to the power supply voltage line 1910, the operation voltage line 1920, and the ground voltage line 1930. The control circuit 1400 may operate based on the power supply voltage VDD supplied from the power supply voltage line 1910.

The control circuit 1400 may receive the power supply voltage VDD, the operation voltage VVDD, and the power signal s2. The control circuit 1400 may output a control signal k0 based on the level of the power supply voltage VDD, the level of the operation voltage VVDD, and the power signal s2. The control signal k0 may selectively have a value of logic "0" or a value of logic "1" based on the level of the power supply voltage VDD, the level of the operation voltage VVDD, and the power signal s2.

In the following descriptions, a signal may selectively have a value of logic "0" or a value of logic "1". In this case, the signal may have a voltage level corresponding to a logical value. For example, the control signal k0 having a value of logic "1" may have a first voltage level. The control signal k0 having a value of logic "0" may have a second voltage level.

The dedicated switch circuit 1300 may be connected to the power supply voltage line 1910 and the operation voltage line 1920. The dedicated switch circuit 1300 may receive the control signal k0. Depending on the control signal k0, the dedicated switch circuit 1300 may connect the operation voltage line 1920 to the power supply voltage line 1910 or may disconnect the operation voltage line 1920 from the power supply voltage line 1910. The connection and the disconnection may be an electrical connection and an electrical disconnection, respectively.

The logic block 1100 may be connected to the power supply voltage line 1910 and the ground voltage line 1930. The logic block 1100 may operate based on the operation voltage VVDD supplied from the operation voltage line 1920. For example, the logic block 1100 may receive data from the outside or may output data to the outside.

The logic block 1100 may store the input data. The logic block 1100 may lose the stored data when the level of the operation voltage VVDD supplied is lower than a level of a loss voltage. For example, the level of the loss voltage may be a level of the operation voltage VVDD when a component (e.g., a flip-flop or a latch) included in the logic block 1100 starts to lose data stored in the component. The level of the loss voltage may vary with influence of a manufacturing process or with a temperature of an electronic device including the power gating circuit 1000.

A leakage current which occurs in the logic block 1100 may decrease as the level of the operation voltage VVDD decreases. In the example embodiments of the present disclosure, the power gating circuit 1000 may reduce the leakage current occurring in the logic block 1100 by decreasing the level of the operation voltage VVDD while the logic block 1100 is in the maintaining state. Also, the power consumption of the electronic device may be reduced.

However, the logic block 1100 may lose the stored data when the level of the operation voltage VVDD supplied is lower than the level of the loss voltage. Accordingly, while the logic block 1100 is in the maintaining state, the power gating circuit 1000 may make the level of the operation voltage VVDD higher than the level of the loss voltage.

The following descriptions will be given as the power controller 1150 generates the two power signals s1 and s2. However, the inventive concepts are not limited thereto. For example, the power controller 1150 may generate a plurality of power signals. Also, the following descriptions will be given as one power gating circuit 1000 receives the power signals s1 and s2. However, the inventive concepts are not limited thereto. Each of one or more power gating circuits may receive power signals. Power signals which the one or more power gating circuits receive may be different from each other. Based on power signals, each of the one or more power gating circuits may control operation states of one or more logic blocks. In this case, the one or more power gating circuits may include different power supply voltage lines, different operation voltage lines, and different ground voltage lines. Also, the power controller 1150 may be connected to a power supply voltage line which is different from the power supply voltage line 1910 of the power gating circuit 1000.

An operation of the power gating circuit 1000 which control the level of the operation voltage VVDD will be described with reference to FIGS. 3 to 17.

Figure 3:
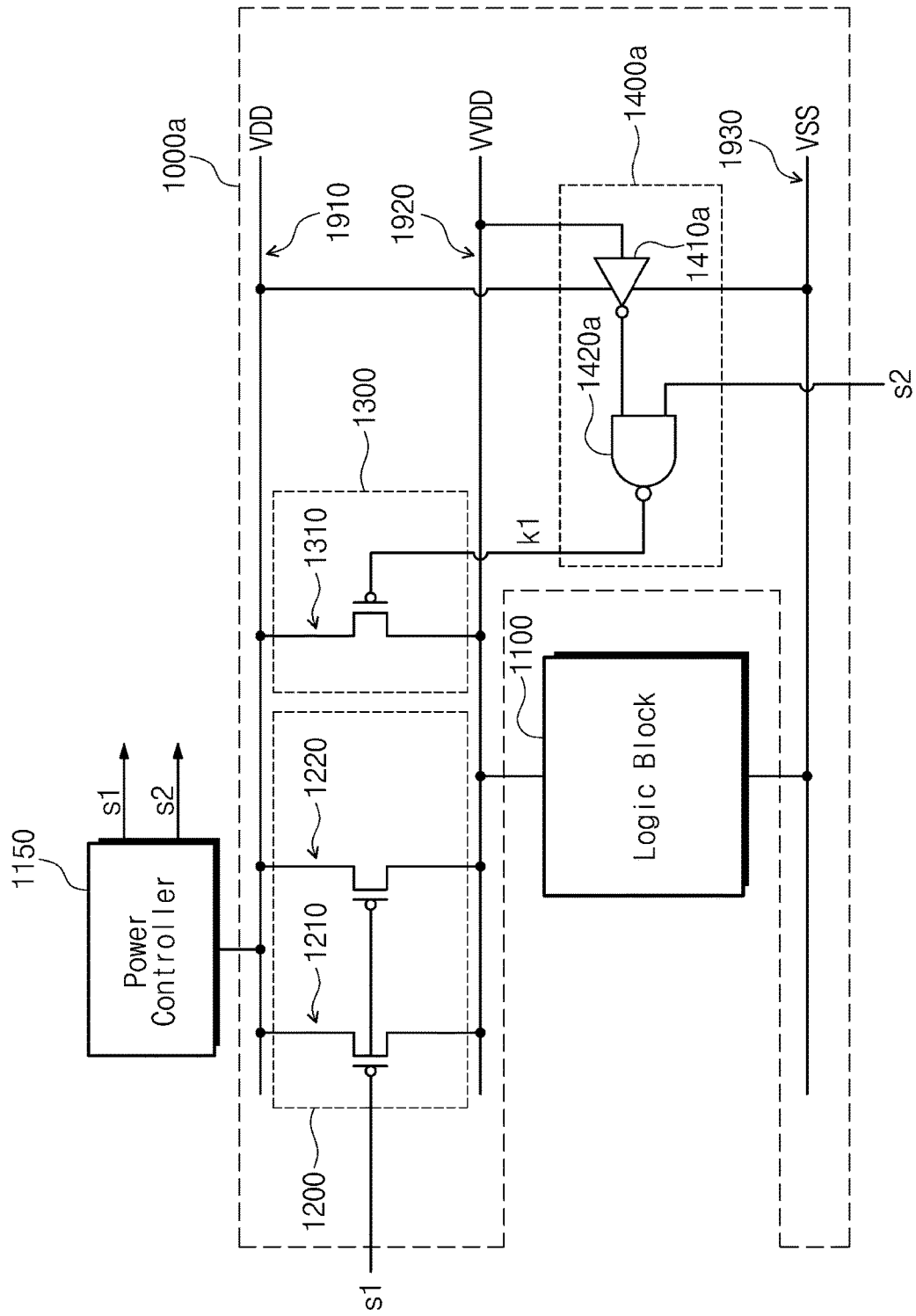
FIG. 3 is a circuit diagram illustrating an example configuration of a power gating circuit of FIG. 2.

FIG. 3 is a circuit diagram illustrating an example configuration of a power gating circuit of FIG. 2. A power gating circuit 1000a of FIG. 3 corresponds to the example embodiment of the power gating circuit 1000 of FIG. 2. For better understanding, FIG. 2 will be referenced together with FIG. 3.

The power switch circuit 1200 may include power switches 1210 and 1220. For example, each of the power switches 1210 and 1220 may include a PMOS transistor. In the case where each of the power switches 1210 and 1220 is a PMOS transistor, source terminals of the PMOS transistors may be connected to the power supply voltage line 1910, and drain terminals of the PMOS transistors may be connected to the operation voltage line 1920. Threshold voltages Vth of the power switches 1210 and 1220 may be identical to or different from each other. The following descriptions will be given as the power switch circuit 1200 includes the two power switches 1210 and 1220. However, the inventive concepts are not limited thereto. For example, the power switch circuit 1200 may include one or more power switches.

The power switch circuit 1200 may receive the power signal s1. Depending on the power signal s1, the power switches 1210 and 1220 may connect the operation voltage line 1920 to the power supply voltage line 1910 or may disconnect the operation voltage line 1920 from the power supply voltage line 1910.

For example, in the case where the power signal s1 has a value of logic "0", the power switches 1210 and 1220 may connect the operation voltage line 1920 to the power supply voltage line 1910. In the case where the power supply voltage line 1910 is connected to the operation voltage line 1920, a current may flow from the power supply voltage line 1910 to the operation voltage line 1920 through the power switches 1210 and 1220.

For example, in the case where the power signal s1 has a value of logic "1", the power switches 1210 and 1220 may disconnect the operation voltage line 1920 from the power supply voltage line 1910. In the case where the power supply voltage line 1910 is disconnected from the operation voltage line 1920, a current may not flow from the power supply voltage line 1910 to the operation voltage line 1920 through the power switches 1210 and 1220.

A control circuit 1400a may be a gate circuit including one or more logic gates. The control circuit 1400a may include a first gate 1410a and a second gate 1420a. For example, the first gate 1410a and the second gate 1420a may be an inverter and a Nand gate, respectively.

A first power terminal of the first gate 1410a may be connected to the power supply voltage line 1910, and a second power terminal of the first gate 1410a may be connected to the ground voltage line 1930. The first gate 1410a may receive the operation voltage VVDD.

The first gate 1410a may generate a signal based on the level of the operation voltage VVDD and a first reference level. The first gate 1410a may selectively generate one of signals having different logical values, based on the level of the operation voltage VVDD received. For example, the first gate 1410a may output a signal having a value of logic "0" when the level of the operation voltage VVDD is higher than the first reference level. The first gate 1410a may output a signal having a value of logic "1" when the level of the operation voltage VVDD is lower than the first reference level.

The first reference level of the first gate 1410a may be higher than the level of the loss voltage. The first reference level may be a level which is determined based on the level of the power supply voltage VDD and a type of the first gate 1410a. The first reference level may be a level between the level of the power supply voltage VDD and the level of the ground voltage VSS. The first reference level may be proportional to the level of the power supply voltage VDD.

A ratio of a level difference between the first reference level and the level of the power supply voltage VDD and a level difference between the first reference level and the level of the ground voltage VSS may be determined based on a type of the first gate 1410a. For example, with regard to the level of the same power supply voltage VDD, the first reference level when the first gate 1410a is a Nand gate may be higher than the first reference level when the first gate 1410a is an inverter. The first reference level according to a type of the first gate 1410a will be described with reference to FIGS. 6 and 7. The control circuit 1400a may be configured such that the first reference level L1 changes based on the type of the first gate 1410a and a level of the ground voltage VSS on the ground voltage line 1930.

The second gate 1420a may output a control signal k1 based on the power signal s2 and a signal output from the first gate 1410a. For example, the control signal k1 may have a value of logic "0" when each of the power signal s2 and the signal output from the first gate 1410a has a value of logic "1". For another example, the control signal k1 may have a value of logic "1" when at least one of the power signal s2 and the signal output from the first gate 1410a has a value of logic "0". The control signal k1 may be output to the dedicated switch circuit 1300.

The dedicated switch circuit 1300 may include a dedicated switch 1310. For example, the dedicated switch 1310 may include a PMOS transistor. In the case where the dedicated switch 1310 is a PMOS transistor, a source terminal of the PMOS transistor may be connected to the power supply voltage line 1910, and a drain terminal of the PMOS transistor may be connected to the operation voltage line 1920. The following descriptions will be given as the dedicated switch circuit 1300 includes one dedicated switch 1310. However, the inventive concepts are not limited thereto. For example, the dedicated switch circuit 1300 may include one or more dedicated switches.

The dedicated switch circuit 1300 may receive the control signal k1. Depending on the control signal k1, the dedicated switch circuit 1300 may connect the operation voltage line 1920 to the power supply voltage line 1910 or may disconnect the operation voltage line 1920 from the power supply voltage line 1910.

For example, in the case where the control signal k1 has a value of logic "0", the dedicated switch 1310 may connect the operation voltage line 1920 to the power supply voltage line 1910. In the case where the operation voltage line 1920 is connected to the operation voltage line 1910, a current from the power supply voltage line 1910 to the operation voltage line 1920 through the dedicated switch 1310 may flow.

For example, in the case where the control signal k1 has a value of logic "1", the dedicated switch 1310 may disconnect the operation voltage line 1920 from the power supply voltage line 1910. In the case where the operation voltage line 1920 is disconnected from the power supply voltage line 1910, a current from the power supply voltage line 1910 to the operation voltage line 1920 through the dedicated switch 1310 may not flow.

Figure 4:
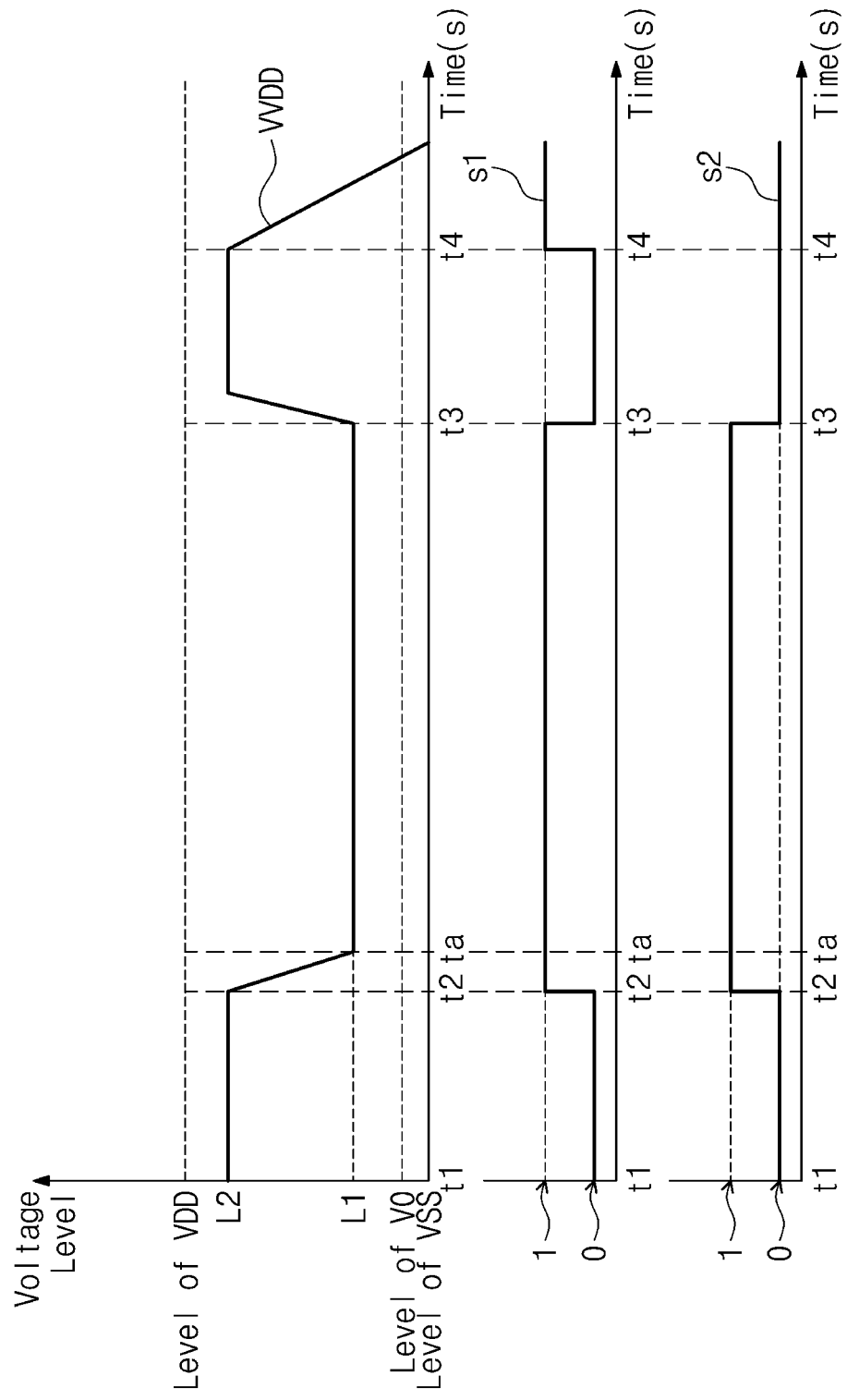
FIG. 4 is a graph illustrating example waveforms of an operation voltage and power signals according to an operation state of a logic block in a power gating circuit of FIG. 3.

FIG. 4 is a graph illustrating waveforms of an operation voltage and power signals according to an operation state of a logic block in a power gating circuit of FIG. 3. For better understanding, FIG. 3 will be referenced together with FIG. 4.

The power gating circuit 1000 may control an operation state of the logic block 1100 based on the power signals s1 and s2. The power gating circuit 1000 may operate in different modes depending on the power signals s1 and s2.

Between a time "t1" and a time "t2", each of the power signals s1 and s2 may have a value of logic "0". In this case, the power gating circuit 1000 may operate in a first mode. In operation of the first mode, the power gating circuit 1000a may allow the level of the operation voltage VVDD to remain at a level L2 based on the power signals s1 and s2 and the control signal k1. The power gating circuit 1000 may control the logic block 1100 such that the logic block 1100 is in the full operation state.

For example, in the case where the power signal s2 has a value of logic "0", the second gate 1420a may output the control signal k1 having a value of logic "1". The dedicated switch 1310 may disconnect the operation voltage line 1920 from the power supply voltage line 1910 based on the control signal k1 having a value of logic "1".

For example, in the case where the power signal s1 has a value of logic "0", the power switches 1210 and 1220 may connect the operation voltage line 1920 to the power supply voltage line 1910. The level of the operation voltage VVDD may be pulled up approximate to the level of the power supply voltage VDD. Accordingly, the level L2 of the operation voltage VVDD may approximate to the level of the power supply voltage VDD. The level L2 of the operation voltage VVDD may be lower than the level of the power supply voltage VDD due to resistances of the power switches 1210 and 1220.

Between a time "t2" and a time "t3", each of the power signals s1 and s2 may have a value of logic "1". In this case, the power gating circuit 1000 may operate in a second mode. In operation of the second mode, the power gating circuit 1000*a* may allow the level of the operation voltage VVDD to approximate to a first reference level L1 based on the power signals s1 and s2 and the control signal k1. The power gating circuit 1000 may control the logic block 1100 such that the logic block 1100 is in the maintaining state.

In the case where the logic block 1100 is in the maintaining state, the level of the operation voltage VVDD may be lower than the level L2 and may be higher than the level of a loss voltage V0. The level of the loss voltage V0 may be higher than the level of the ground voltage VSS.

For example, in the case where the power signal s1 has a value of logic "1", the power switches 1210 and 1220 may disconnect the operation voltage line 1920 from the power supply voltage line 1910.

For example, in the case where the power signal s2 has a value of logic "1", a logical value of the control signal k1 may be determined based on a logical value of a signal output from the first gate 1410*a*.

The first gate 1410*a* may output a signal having a value of logic "0" when the level of the operation voltage VVDD is higher than the first reference level L1. In the case where the first gate 1410*a* outputs the signal having a value of logic "0", the control signal k1 may have a value of logic "1". In this case, the dedicated switch 1310 may disconnect the operation voltage line 1920 from the power supply voltage line 1910 based on the control signal k1 having a value of logic "1".

The first gate 1410*a* may output a signal having a value of logic "1" when the level of the operation voltage VVDD is lower than the first reference level L1. In the case where the first gate 1410*a* outputs the signal having a value of logic "1", the control signal k1 may have a value of logic "0". In this case, the dedicated switch 1310 may connect the operation voltage line 1920 to the power supply voltage line 1910 based on the control signal k1 having a value of logic "0".

The dedicated switch 1310 may connect the operation voltage line 1920 to the power supply voltage line 1910 until the level of the operation voltage VVDD is higher than the first reference level L1. The dedicated switch 1310 may disconnect the operation voltage line 1920 from the power supply voltage line 1910 when the level of the operation voltage VVDD is higher than the first reference level L1.

The level of the operation voltage VVDD may decrease to the first reference level L1 between the time "t2" and a time "ta", and an iteration of an increase and decrease may be maintained in a range between a level lower than the level of the first reference level L1 and a level higher than the first reference level L1 during a time interval from the time "ta" to the time "t3". The level of the operation voltage VVDD may approximate to the first reference level L1. However, for better understanding, it may be assumed that the level of the operation voltage VVDD is maintained at the first reference level L1 while the logic block 1100 is in the maintaining state. Accordingly, the level of the operation voltage VVDD while the logic block 1100 is in the maintaining state may be lower than the level L2 of the operation voltage VVDD while the logic block 1100 is in the full operation state.

Between the time "t3" and a time "t4", a first operation signal may be input to the power controller 1150. As the first operation signal is received, the logic block 1100 may again operate in the full operation state. In this case, the level of the operation voltage VVDD may be pulled up approximate to the level of the power supply voltage VDD by the power switches 1210 and 1220. Accordingly, the level of the operation voltage VVDD may again be increased to the level L2.

At the time "t4", a second operation signal may be input to the power controller 1150. The power controller 1150 may generate power signal s1 having a value of logic "1" and the power signal s2 having a value of logic "0", based on the second operation signal. In this case, the power gating circuit 1000 may operate in a third mode. In operation of the third mode, the power gating circuit 1000*a* may allow the level of the operation voltage VVDD to be lower than the level of the loss voltage V0 based on the power signals s1 and s2 and the control signal k1. For example, the level of the operation voltage VVDD may approximate to the level of the ground voltage VSS. The power gating circuit 1000 may control the logic block 1100 such that the logic block 1100 is in the non-operation state.

For example, in the case where the power signal s1 has a value of logic "1", the power switches 1210 and 1220 may disconnect the operation voltage line 1920 from the power supply voltage line 1910.

For example, in the case where the power signal s2 has a value of logic "0", the second gate 1420*a* may output the control signal k1 having a value of logic "1". The dedicated switch 1310 may disconnect the operation voltage line 1920 from the power supply voltage line 1910 based on the control signal k1 having a value of logic "1".

Accordingly, in the case where the logic block 1100 is in the non-operation state, the level of the operation voltage VVDD may approximate to the level of the ground voltage VSS.

According to the above operations, while the logic block 1100 is in the maintaining state, the level of the operation voltage VVDD may be controlled to be lower than the level of the power supply voltage VDD and to be higher than the level of the loss voltage V0. Accordingly, in the maintaining state, even though a leakage current occurring in the logic block 1100 decreases, data of the logic block 1100 may not be lost.

Figure 5:
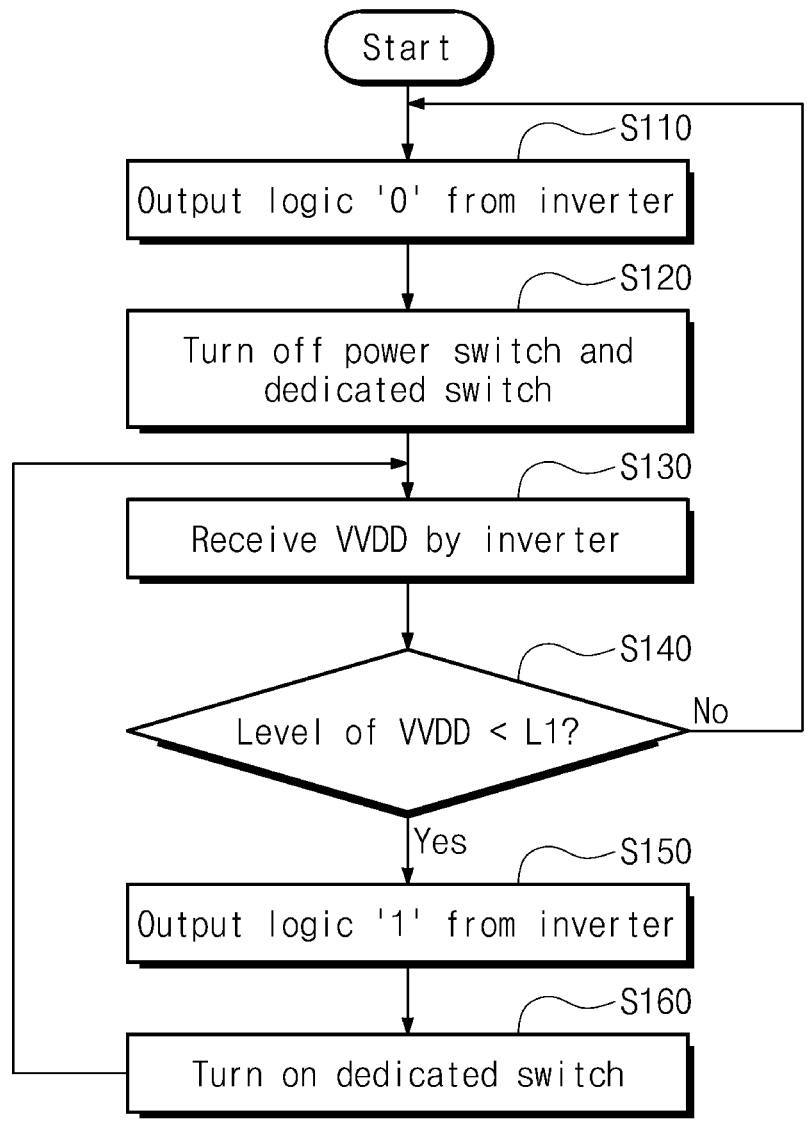
FIG. 5 is a flowchart for describing an example operation of a power gating circuit while a logic block of FIG. 3 is in a maintaining state.

FIG. 5 is a flowchart for describing an operation of a power gating circuit while a logic block of FIG. 3 is in a maintaining state. For better understanding, FIGS. 3 and 4 will be referenced together.

Before logic block 1100 enters the maintaining state, the level of the operation voltage VVDD may be maintained at the level L2. While the logic block 1100 is in the maintaining state, each of the power signals s1 and s2 may have a value of logic "1".

In operation S110, the level of the operation voltage VVDD may be higher than the first reference level L1. Accordingly, the first gate 1410*a* may output a signal having a value of logic "0".

In operation S120, the power signal s1 may have a value of logic "1". While the logic block 1100 is in the maintaining state, the power switches 1210 and 1220 may disconnect the operation voltage line 1920 from the power supply voltage line 1910 based on the power signal s1.

The power signal s2 may have a value of logic "1". The dedicated switch 1310 may disconnect the operation voltage line 1920 from the power supply voltage line 1910 based on the power signal s2 and the signal output from the first gate 1410*a*.

In operation S130, the first gate 1410*a* may receive the operation voltage VVDD. Accordingly, in operation S140, the first gate 1410*a* may generate the signal based on the level of the operation voltage VVDD and the first reference level L1. The signal output from the first gate 1410*a* may have a value of logic "0" or a value of logic "1", based on the level of the operation voltage VVDD and the first reference level L1.

When the level of the operation voltage VVDD is lower than the first reference level L1, in operation S150, the first gate 1410a may output the signal having a value of logic "1". In some example embodiments, when the level of the operation voltage VVDD is identical to the first reference level L1, also, the first gate 1410a may be configured to output the signal having a value of logic "1". Afterwards, in operation S160, the dedicated switch 1310 may connect the operation voltage line 1920 to the power supply voltage line 1910 based on the power signal s2 and the signal output from the first gate 1410a.

In contrast, in the case where the level of the operation voltage VVDD is higher than the first reference level L1, the power gating circuit 1000a may repeat operation S110 to operation S140. In this case, the dedicated switch 1310 may disconnect the operation voltage line 1920 from the power supply voltage line 1910.

Figure 6:
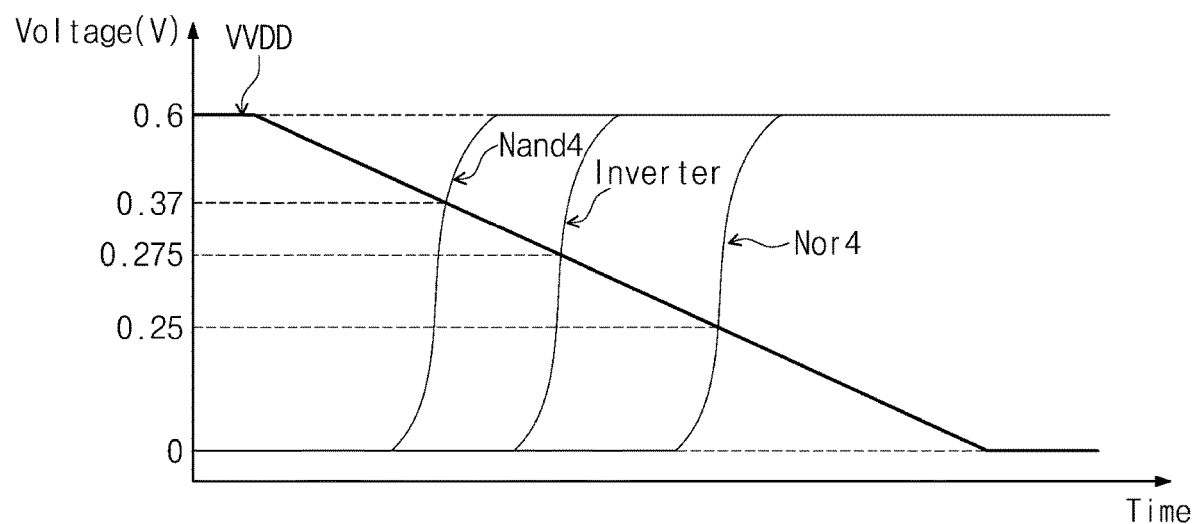
FIGS. 6 and 7 are graphs illustrating example reference levels associated with different types of logic gates.
Figure 7:
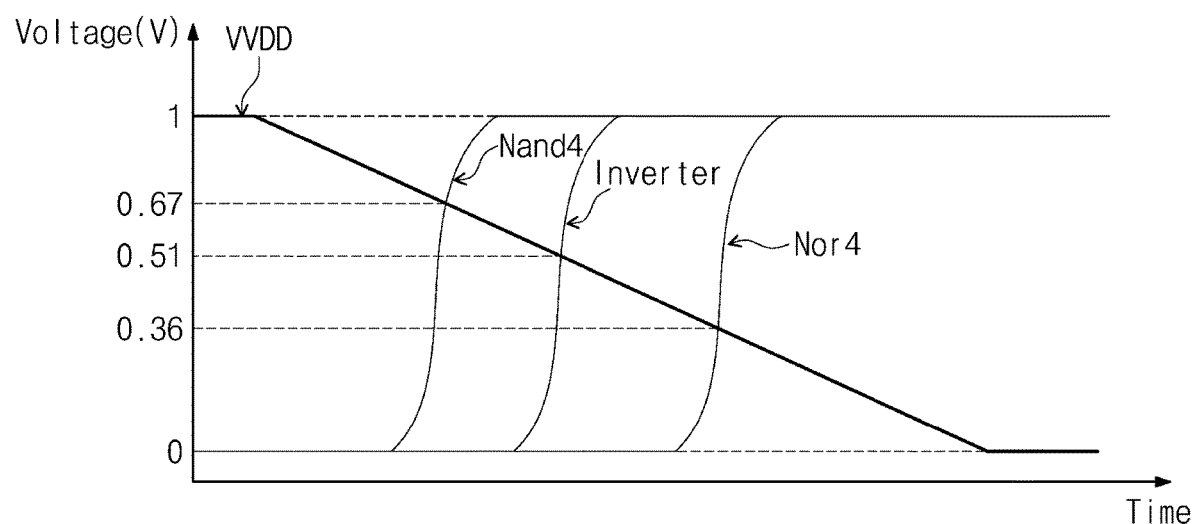

FIGS. 6 and 7 are graphs illustrating reference levels associated with different types of logic gates.

FIGS. 6 and 7 show reference levels of logic gates (e.g., a Nand4 gate, an Inverter, and a Nor4 gate) of different types while the power supply voltage VDD is respectively maintained at 1 V and 0.6 V.

As will be described later, a first power terminal of each of the logic gates (e.g., the Nand4 gate, the Inverter, and the Nor4 gate) may be connected to the power supply voltage VDD. A second power terminal of each of the logic gates (e.g., the Nand4 gate, the Inverter, and the Nor4 gate) may be connected to the ground voltage VSS. The logic gates (e.g., the Nand4 gate, the Inverter, and the Nor4 gate) may receive the operation voltage VVDD.

Each of the logic gates (e.g., the Nand4 gate, the Inverter, and the Nor4 gate) may output a value of logic "0" or a value of logic "1" depending on the level of the received operation voltage VVDD. As the level of the operation voltage VVDD decreases, logical values output from the logic gates (e.g., the Nand4 gate, the Inverter, and the Nor4 gate) may be changed. Each of the logic gates (e.g., the Nand4 gate, the Inverter, and the Nor4 gate) may output a value of logic "0" when the level of the operation voltage VVDD is higher than a reference level. Each of the logic gates (e.g., the Nand4 gate, the Inverter, and the Nor4 gate) may output a value of logic "1" when the level of the operation voltage VVDD is lower than the reference level.

For example, referring to FIG. 7, the Nand4 gate may output a value of logic "0" when the level of the operation voltage VVDD is higher than 0.67 V. The Nand4 gate may output a value of logic "1" when the level of the operation voltage VVDD is lower than 0.67 V. Accordingly, the reference level associated with the Nand4 gate may be "0.67".

As described with reference to FIG. 3, the reference level may be a level which is determined based on the level of the power supply voltage VDD and a type of logic gates. The reference level may correspond to the first reference level described with reference to FIG. 3. Referring to FIG. 6, a reference level of the Nand4 gate, a reference level of the Inverter, and a reference level of the Nor4 gate are 0.37 V, 0.275 V, and 0.25 V, respectively. Referring to FIG. 7, the reference level of the Nand4 gate, the reference level of the Inverter, and the reference level of the Nor4 gate are 0.67 V, 0.51 V, and 0.36 V, respectively.

The first gate 1410a of FIG. 3 may be implemented with a logic gate, the reference level of which is higher than the level of the loss voltage. For example, in the case where the loss voltage of the logic block 1100 is 0.35 V and the level of the power supply voltage VDD is 1 V, the first gate circuit 1410a may be implemented with the Nand4 gate, the Inverter, or the Nor4 gate. For another example, in the case where the loss voltage of the logic block 1100 is 0.35 V and the level of the power supply voltage VDD is 0.6 V, the first gate circuit 1410a may be implemented with the Nand4 gate.

An operation of a power gating circuit when the first gate circuit 1410a is implemented with the Nand4 gate will be described with reference to FIG. 8. An operation of a power gating circuit when the first gate circuit 1410a is implemented with the Nor4 gate will be described with reference to FIG. 9.

Figure 8:
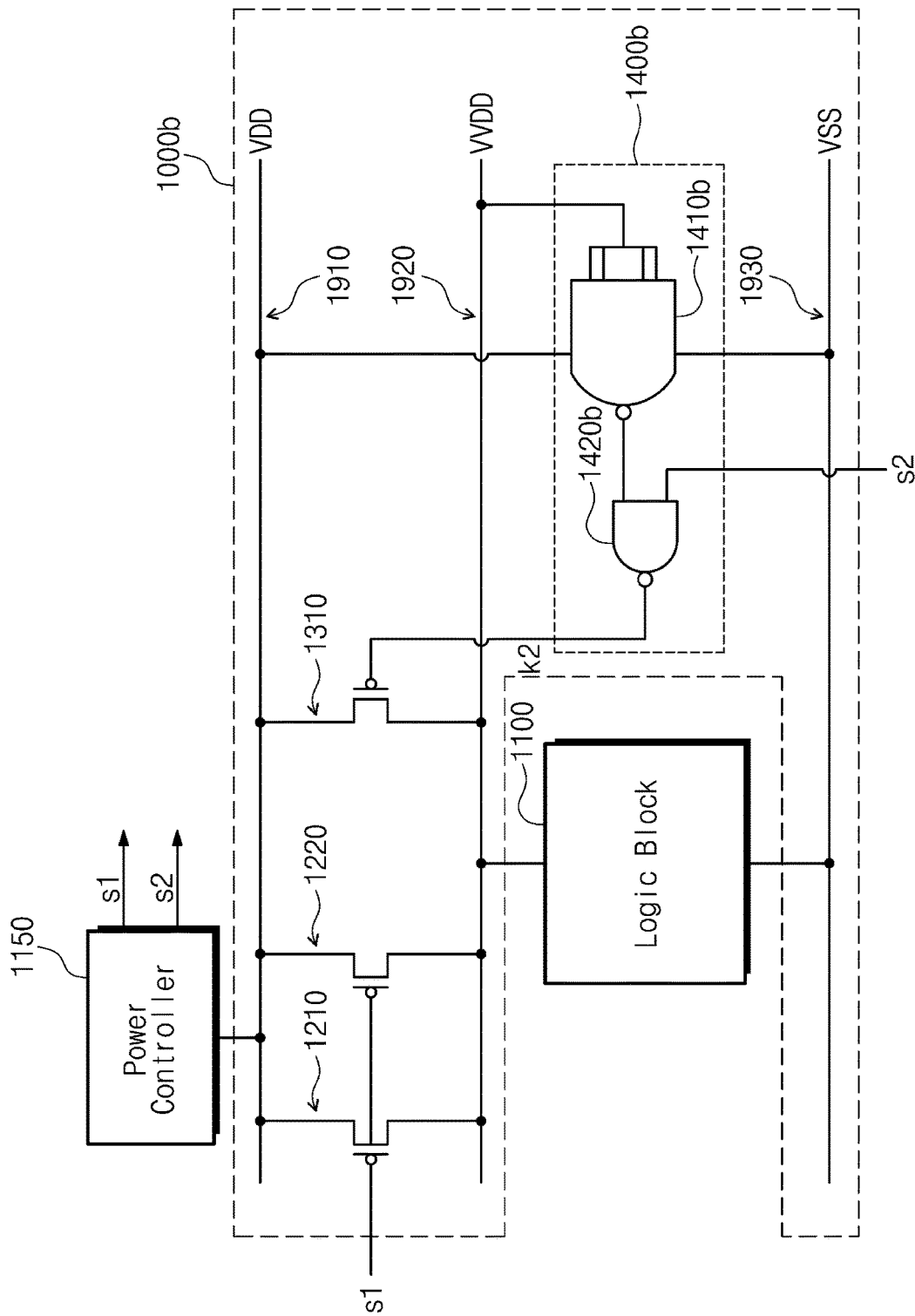
FIG. 8 is a circuit diagram illustrating an example configuration of a power gating circuit of FIG. 2.

FIG. 8 is a circuit diagram illustrating an example configuration of a power gating circuit of FIG. 2.

Components 1210, 1220, 1310, and 1420b of a power gating circuit 1000b illustrated in FIG. 8 may provide configurations and operations corresponding to the components 1210, 1220, 1310, and 1420a of the power gating circuit 1000a of FIG. 3. Thus, additional description will be omitted to avoid redundancy.

A control circuit 1400b may include a first gate 1410b and a second gate 1420b. For example, the first gate 1410b and the second gate 1420b may be a Nand4 gate and a Nand gate, respectively.

As described with reference to FIGS. 6 and 7, a second reference level of the first gate 1410b may be higher than the first reference level of the first gate 1410a. The second reference level may be understood as in the first reference level. The control circuit 1400b may output a control signal k2 having a value of logic "0" at the level of the operation voltage VVDD higher than the level of the operation voltage VVDD, at which the control signal k1 having a value of logic "0" is output from the control circuit 1400a. Accordingly, while the logic block 1100 is in the maintaining state, the level of the operation voltage VVDD which is based on the first gate 1410a may be lower than the level of the operation voltage VVDD which is based on the first gate 1410b. The control circuit 1400b may be configured such that the second reference level changes based on the type of the first gate 1410b and a level of the ground voltage VSS on the ground voltage line 1930.

Figure 9:
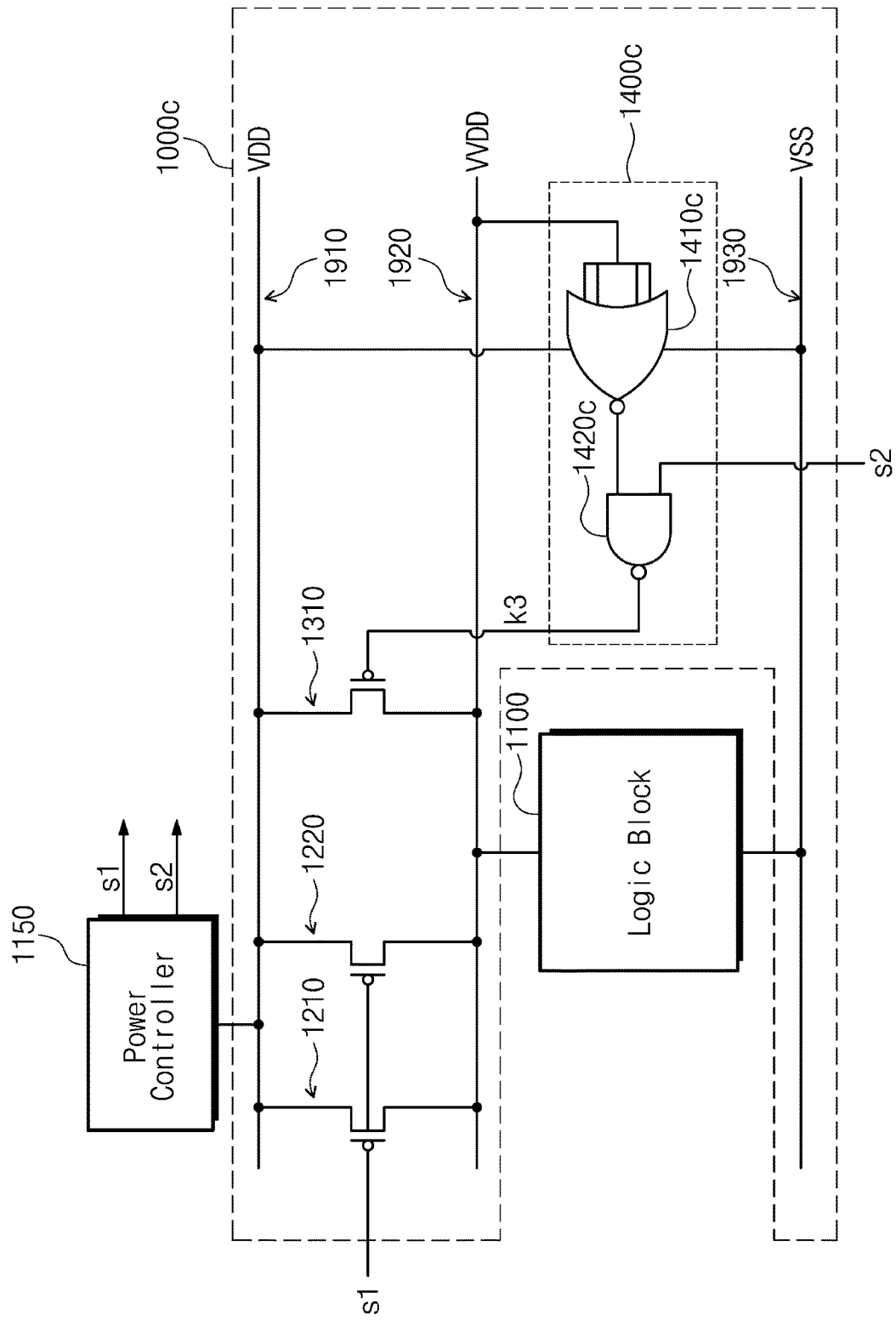
FIG. 9 is a circuit diagram illustrating an example configuration of a power gating circuit of FIG. 2.

FIG. 9 is a circuit diagram illustrating an example configuration of a power gating circuit of FIG. 2.

Components 1210, 1220, 1310, and 1420c of a power gating circuit 1000c illustrated in FIG. 9 may provide configurations and operations corresponding to the components 1210, 1220, 1310, and 1420a of the power gating circuit 1000a of FIG. 3. Thus, additional description will be omitted to avoid redundancy.

A control circuit 1400c may include a first gate 1410c and a second gate 1420c. For example, the first gate 1410c and the second gate 1420c may be a Nor4 gate and a Nand gate, respectively.

As described with reference to FIGS. 6 and 7, a third reference level of the first gate 1410c may be lower than the first reference level of the first gate 1410a. The third reference level may be understood as in the first reference level. The control circuit 1400c may output a control signal k3 having a value of logic "0" at the level of the operation voltage VVDD higher than the level of the operation voltage VVDD, at which the control signal k1 having a value of logic "0" is output from the control circuit 1400a. Accordingly, while the logic block 1100 is in the maintaining state, the level of the operation voltage VVDD which is based on the first gate 1410a may be higher than the level of the operation voltage VVDD which is based on the first gate 1410c.

Figure 10:
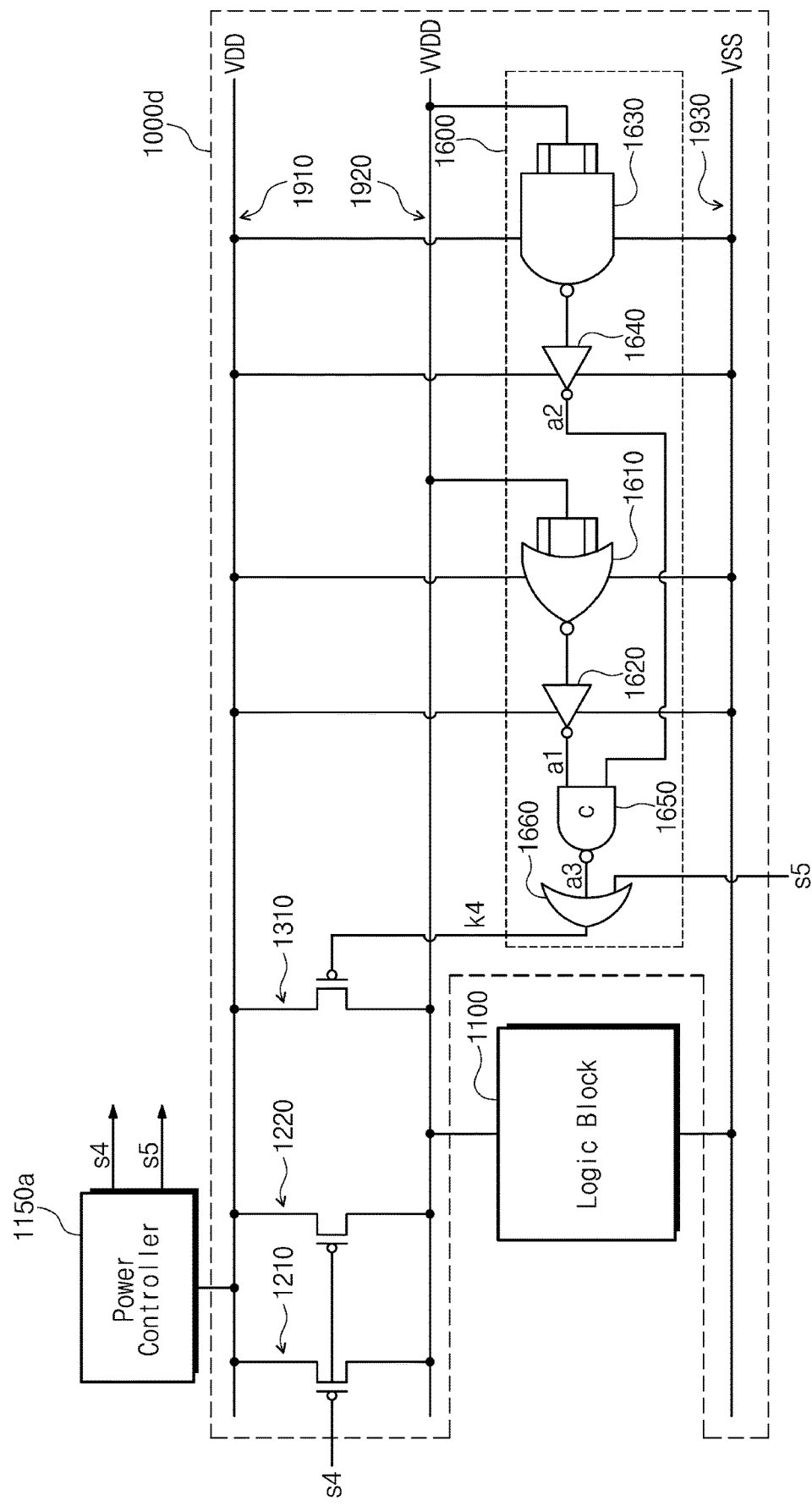
FIG. 10 is a circuit diagram illustrating an example configuration of a power gating circuit of FIG. 2.

FIG. 10 is a circuit diagram illustrating an example configuration of a power gating circuit of FIG. 2.

Components 1210, 1220, and 1310 of a power gating circuit 1000d illustrated in FIG. 10 may provide configurations and operations corresponding to the components 1210, 1220, and 1310 of the power gating circuit 1000a of FIG. 3. Thus, additional description will be omitted to avoid redundancy.

A power controller 1150a may generate power signals s4 and s5 associated with an operation state of the logic block 1100.

Depending on the power signal s4, the power switches 1210 and 1220 may connect the operation voltage line 1920 to the power supply voltage line 1910 or may disconnect the operation voltage line 1920 from the power supply voltage line 1910.

A control circuit 1600 may include a first gate 1610, a first auxiliary gate 1620, a second gate 1630, a second auxiliary gate 1640, a third gate 1650, and a fourth gate 1660. The first gate 1610, the second gate 1630, the third gate 1650, and the fourth gate 1660 may be a Nor4 gate, a Nand4 gate, a c-element, and an OR gate. The first gate 1610 and the second gate 1630 may provide configurations and operations corresponding to the first gate 1410c (refer to FIG. 9) and the first gate 1410b (refer to FIG. 8). Thus, additional description will be omitted to avoid redundancy.

A fourth level of the first gate 1610 and a fifth level of the second gate 1630 may correspond to the third level of the first gate 1410c and the second level of the first gate 1410b, respectively.

The first gate 1610 may compare the level of the operation voltage VVDD and the fourth level to selectively output a signal having a value of logic "0" or a value of logic "1". The first auxiliary gate 1620 may output a signal a1 having a logical value which is different from a logical value of a signal output from the first gate 1610.

The second gate 1630 may compare the level of the operation voltage VVDD and the fifth level to selectively output a signal having a value of logic "0" or a value of logic "1". The second auxiliary gate 1640 may output a signal a2 having a logical value which is different from a logical value of a signal output from the second gate 1630.

The third gate 1650 may receive the signal a1 and the signal a2. The third gate 1650 may output a signal a3 based on the signal a1 and the signal a2. The signal a3 may have a value of logic "0" or a value of logic "1" based on a logical value of the signal a1 and a logical value of the signal a2.

For example, in the case where the third gate 1650 outputs the signal a3 having a value of logic "1", the third gate 1650 may output the signal a3 having a value of logic "1" until each of logical values of the signals a1 and a2 goes to logic "0". In the case where the third gate 1650 outputs the signal s3 having a value of logic "0", the third gate 1650 may output the signal a3 having a value of logic "0" until each of logical values of the signals a1 and a2 goes to logic "1".

The fourth gate 1660 may output a control signal k4 based on the power signal s5 and the signal a3.

For example, while the logic block 1100 is in the full operation state or in the non-operation state, the power signal s5 may have a value of logic "1". In the case where the power signal s5 has a value of logic "1", the control signal k4 may have a value of logic "1" regardless of a logical value of the signal a3.

For example, while the logic block 1100 is in the maintaining state, the power signal s5 may have a value of logic "0". In the case where the power signal s5 has a value of logic "0", the control signal k4 may have the same logical value as a logical value of the signal a3.

Depending on the control signal k4, the dedicated switch 1310 may connect the operation voltage line 1920 to the power supply voltage line 1910 or may disconnect the operation voltage line 1920 from the power supply voltage line 1910.

Figure 11:
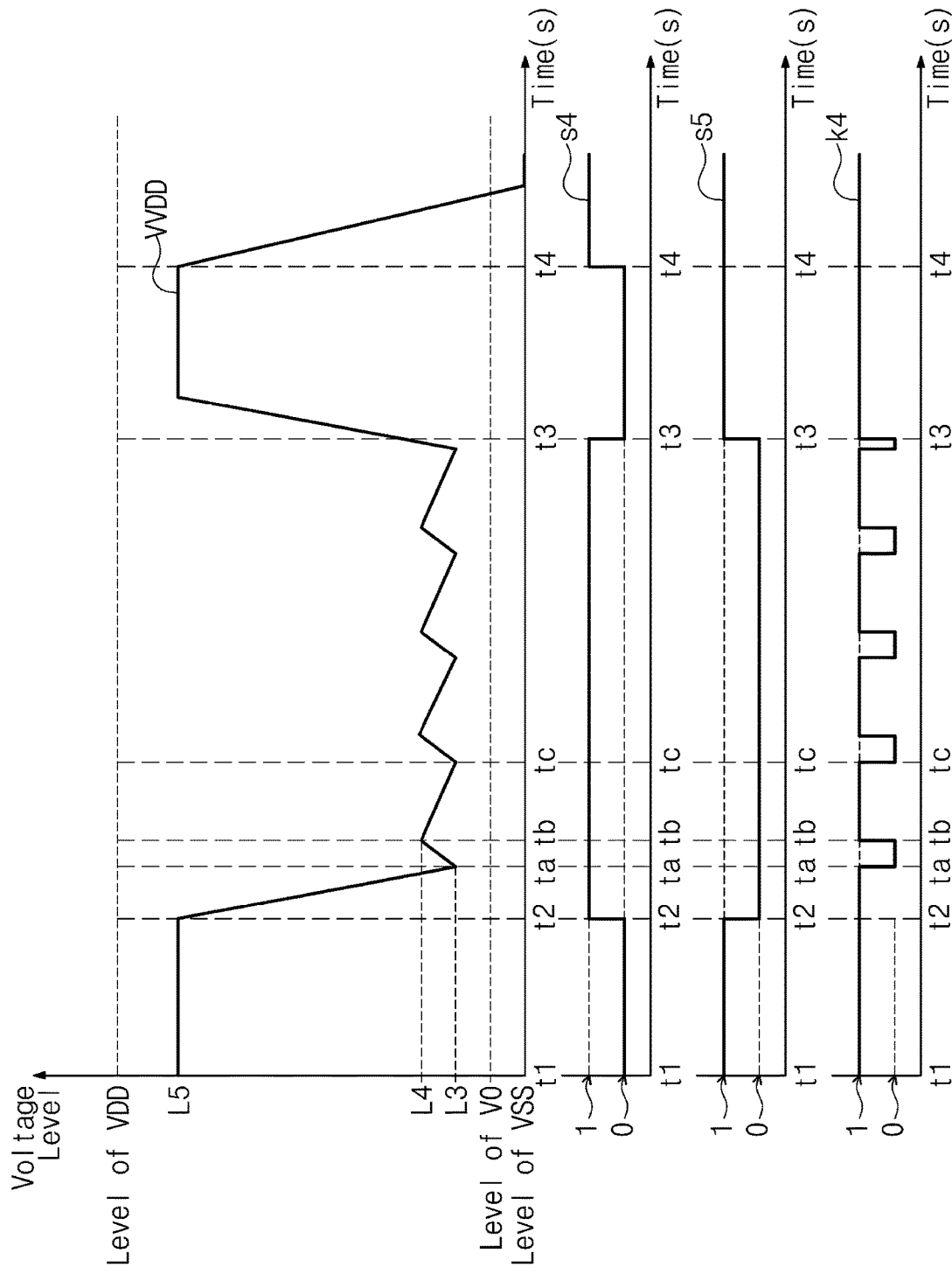
FIG. 11 is a graph illustrating a level of an example operation voltage according to an operation state of a logic block in a power gating circuit of FIG. 10.

FIG. 11 is a graph illustrating a level of an operation voltage according to an operation state of a logic block in a power gating circuit of FIG. 10. For better understanding, FIG. 10 will be referenced together.

In the case where the logic block 1100 is in the full operation state or in the non-operation state, the power gating circuit 1000d disclosed in FIG. 10 may provide operations corresponding to the operations of the power gating circuit 1000a disclosed in FIG. 3. In the case where the logic block 1100 is in the full operation state, a level L5 of the operation voltage VVDD disclosed in FIG. 10 may correspond to the level L2 of the operation voltage VVDD disclosed in FIG. 4. Below, the power gating circuit 1000d will be described under the condition in which the logic block 1100 is in the maintaining state.

The power gating circuit 1000d may control an operation state of the logic block 1100 based on the power signals s4 and s5. From the time "t2" to the time "t3", while the logic block 1100 is in the maintaining state, the power signal s4 and the power signal s5 may have a value of logic "1" and a value of logic "0", respectively. The power switches 1210 and 1220 may disconnect the operation voltage line 1920 from the power supply voltage line 1910 based on the power signal s4. In the case where a logical value of the power signal s5 is "0", the control signal k4 may have the same logical value as the signal a3.

As described with reference to FIG. 10, the signal a1 may have a value of logic "0" when the level of the operation voltage VVDD is lower than the fourth reference level. The signal a2 may have a value of logic "0" when the level of the operation voltage VVDD is lower than the fifth reference level. Since the fourth reference level is lower than the fifth reference level, the third gate 1650 may output a signal having a value of logic "0" when the level of the operation voltage VVDD is lower than the fourth reference level. The fourth gate 1660 may output the control signal k4 having a value of logic "0".

The signal a1 may have a value of logic "1" when the level of the operation voltage VVDD is higher than the fourth reference level. The signal a2 may have a value of logic "1" when the level of the operation voltage VVDD is higher than the fifth reference level. Since the fifth reference level is higher than the fourth reference level, the third gate 1650 may output the signal a3 having a value of logic "1" when the level of the operation voltage VVDD is higher than the fifth reference level. The fourth gate 1660 may output the control signal k4 having a value of logic "1".

Between the time "t2" and the time "ta", the control signal k4 may have a value of logic "1". The dedicated switch 1310 may disconnect the operation voltage line 1920 from the power supply voltage line 1910 based on the control signal k4. Accordingly, the level of the operation voltage VVDD may decrease from the time "t2" to the time "ta". The signal k4 may have a value of logic "0" when the level of the operation voltage VVDD is lower than the fourth reference level. At the time "ta", the level of the operation voltage VVDD may be lower than the fourth reference level. At the time "ta", the level of the operation voltage VVDD may be the level L3. The level L3 may be lower than the fourth reference level of the first gate 1610. However, the level L3 may approximate to the fourth reference level. Accordingly, the reference level L3 may be higher than the level of the loss voltage V0.

Between the time "ta" and a time "tb", the control signal k4 may have a value of logic "0". The dedicated switch 1310 may connect the operation voltage line 1920 to the power supply voltage line 1910 based on the control signal k4. Accordingly, the level of the operation voltage VVDD may increase from the time "ta" to the time "tb". The control signal k4 may have a value of logic "1" when the level of the operation voltage VVDD is higher than the fifth reference level. At the time "tb", the level of the operation voltage VVDD may be higher than the fifth reference level. At the time "tb", the level of the operation voltage VVDD may be a level L4. The level L4 may be higher than the fifth reference level of the second gate 1630. However, the level L4 may approximate to the fifth reference level. Accordingly, the level L4 may be lower than the level L5.

From the time "tb" to a time "tc" at which the level of the operation voltage VVDD is lower than the fourth reference level, the control signal k4 may have a value of logic "1". Accordingly, from the time "tb" at which the operation voltage line 1920 is disconnected from the power supply voltage line 1910 to the time "tc" at which the operation voltage line 1920 is connected to the power supply voltage line 1910, the level of the operation voltage VVDD may again decrease to the level L3.

An increase and decrease in the level of the operation voltage VVDD may be repeated depending on the operations from the time "ta" to the time "tc". In response to the power signals s4 and s5 and the control signal k4, the power gating circuit 1000d may allow the level of the operation voltage VVDD to be between the level L3 and the level L4.

The level of the operation voltage VVDD described with reference to FIGS. 3 and 4 may be maintained at substantially one voltage level L1 while the logic block 1100 is in the maintaining state. To maintain the level of the operation voltage VVDD at substantially one voltage level L1, the dedicated switch 1310 of FIG. 3 should repeat a switching operation without a pause. The switching operation may be an operation of connecting the operation voltage line 1920 to the power supply voltage line 1910 and disconnecting the operation voltage line 1920 from the power supply voltage line 1910.

In contrast, the level of the operation voltage VVDD described with reference to FIGS. 10 and 11 may be maintained between the level L3 and the level L4 while the logic block 1100 is in the maintaining state. Accordingly, the dedicated switch 1310 of FIG. 10 may perform a switching operation only when the level of the operation voltage VVDD reaches the level L3 or the level L4. Accordingly, the power consumption of the dedicated switch 1310 illustrated in FIG. 10 may be smaller than the power consumption of the dedicated switch 1310 illustrated in FIG. 3.

Figure 12:
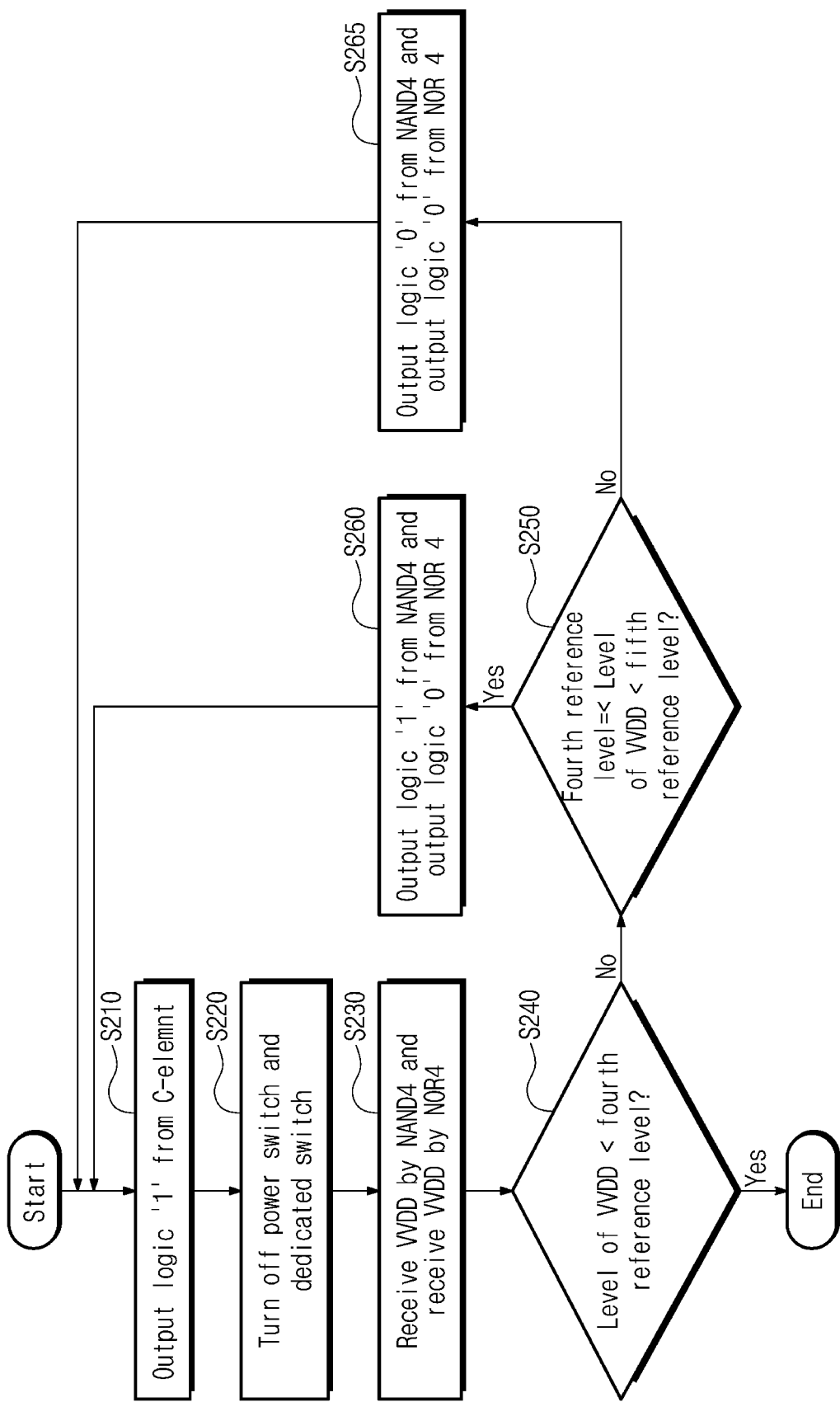
FIG. 12 is a flowchart for describing an example operation of a power gating circuit in the case where a level of an operation voltage decreases while a logic block of FIG. 10 is in a maintaining state.

FIG. 12 is a flowchart for describing an operation of a power gating circuit in the case where a level of an operation voltage decreases while a logic block of FIG. 10 is in a maintaining state. For better understanding, FIGS. 10 and 11 will be referenced together.

It is assumed that the logic block 1100 is in the full operation state before the logic block 1100 enters the maintaining state.

Accordingly, as described with reference to FIG. 11, in operation S210, the first auxiliary gate 1620 may output the signal a1 having a value of logic "1". Also, the second auxiliary gate 1640 may output the signal a2 having a value of logic "1". The third gate 1650 may output the signal a3 having a value of logic "1" based on the signal a1 and the signal a2. The control signal k4 may have the same logical value as the signal a3.

In operation S220, the dedicated switch 1310 may disconnect the operation voltage line 1920 from the power supply voltage line 1910 based on the control signal k4. The power switches 1210 and 1220 may disconnect the operation voltage line 1920 from the power supply voltage line 1910 based on the power signal s4.

In operation S230, each of the first gate 1610 and the second gate 1630 may receive the operation voltage VVDD.

In operation S240 and operation S250, the first gate 1610 may output a signal based on the level of the operation voltage VVDD and the fourth reference level. The second gate 1630 may output a signal based on the level of the operation voltage VVDD and the fifth reference level.

The level of the operation voltage VVDD may be increased when the level of the operation voltage VVDD is lower than the fourth reference level.

When the level of the operation voltage VVDD is not lower than the fourth reference level and the level of the operation voltage VVDD is lower than the fifth reference level, in operation S260, the first gate 1610 and the second gate 1630 may output a signal having a value of logic "0" and a signal having a value of logic "1", respectively. The signal a1 and the signal a2 may respectively have a value of logic "1" and a value of logic "0" based on the signal output from the first gate 1610 and the signal output from the second gate 1630. The power gating circuit 1000d may repeat operation S210 to operation S250.

When the level of the operation voltage VVDD is not lower than the fifth reference level, in operation S265, each of the first gate 1610 and the second gate 1630 may output a signal having a value of logic "0". Each of the signal a1 and the signal a2 may respectively have a value of logic "1" based on the signal output from the first gate 1610 and the signal output from the second gate 1630. The power gating circuit 1000d may repeat operation S210 to operation S250.

Figure 13:
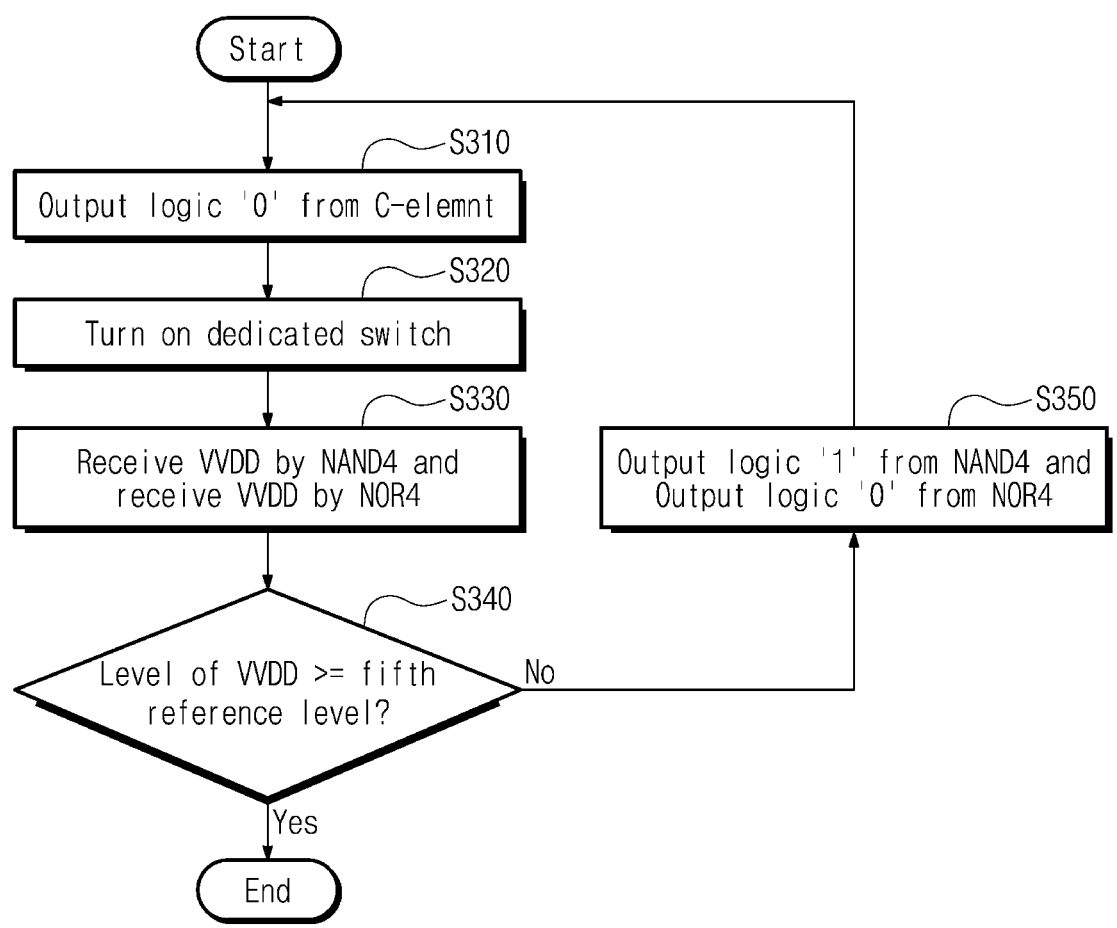
FIG. 13 is a flowchart for describing an example operation of a power gating circuit in the case where a level of an operation voltage increases while a logic block of FIG. 10 is in a maintaining state.

FIG. 13 is a flowchart for describing an operation of a power gating circuit in the case where a level of an operation voltage increases while a logic block of FIG. 10 is in a maintaining state. For better understanding, FIGS. 10 and 11 will be referenced together.

In operation S310, the first auxiliary gate 1620 may output the signal a1 having a value of logic "0". Also, the second auxiliary gate 1640 may output the signal a2 having a value of logic "0". The third gate 1650 may output the signal a3 having a value of logic "0" based on the signal a1 and the signal a2. The control signal k4 may have the same logical value as the signal a3.

In operation S320, the dedicated switch 1310 may connect the operation voltage line 1920 to the power supply voltage line 1910 based on the control signal k4.

In operation S330, each of the first gate 1610 and the second gate 1630 may receive the operation voltage VVDD.

Accordingly, in operation S340, the first gate 1610 may output a signal based on the level of the operation voltage VVDD and the fourth reference level. The second gate 1630 may output a signal based on the level of the operation voltage VVDD and the fifth reference level.

The level of the operation voltage VVDD may be decreased when the level of the operation voltage VVDD is not lower than the fifth reference level.

When the level of the operation voltage VVDD is lower than the fifth reference level, in operation S350, the level of the operation voltage VVDD may be not lower than the fourth reference level. The first gate 1610 and the second gate 1630 may output a signal having a value of logic "0" and a signal having a value of logic "1", respectively. The signal a1 and the signal a2 may respectively have a value of logic "1" and a value of logic "0" based on the signal output from the first gate 1610 and the signal output from the second gate 1630. The power gating circuit 1000*d* may repeat operation S310 to operation S340.

Figure 14:
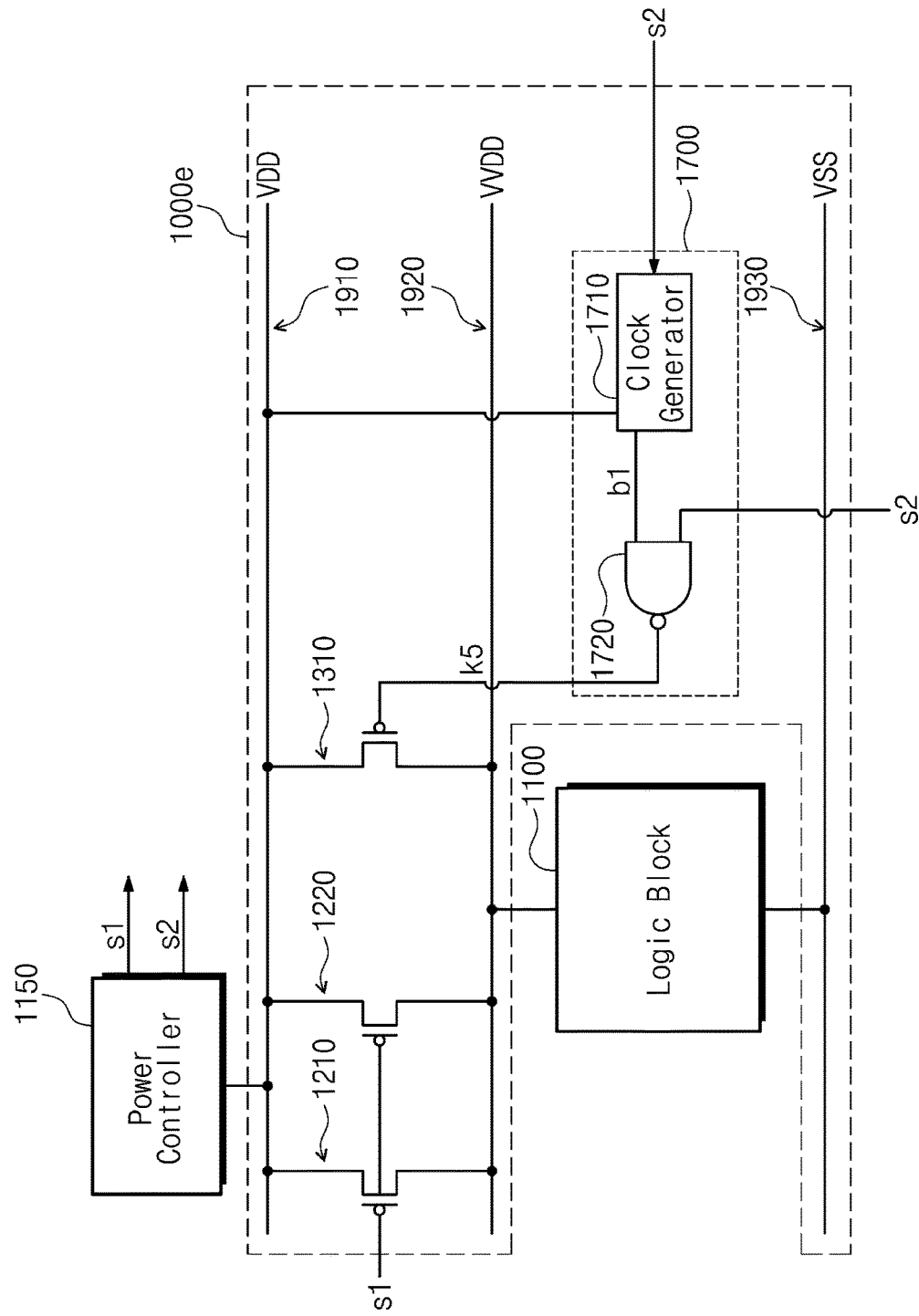
FIG. 14 is a circuit diagram illustrating an example configuration of a power gating circuit of FIG. 2.

FIG. 14 is a circuit diagram illustrating an example configuration of a power gating circuit of FIG. 2.

Components 1210, 1220, 1310, and 1720 of a power gating circuit 1000*e* may provide configurations and operations corresponding to the components 1210, 1220, 1310, and 1420*a* of the power gating circuit 1000*a* of FIG. 3. Thus, additional description will be omitted to avoid redundancy.

A control circuit 1700 may include a clock generator 1710 and a first gate 1720.

The clock generator 1710 may be supplied with the power supply voltage VDD from the power supply voltage line 1910. The clock generator 1710 may receive the power signal s2. The clock generator 1710 may operate based on the supplied power supply voltage VDD and the power signal s2. The power signal s2 may have a value of logic "1" when the logic block 1100 is in the maintaining state. The clock generator 1710 may output a clock signal b1 when a logical value of the power signal s2 is "1".

The first gate 1720 may output a control signal k5 based on the power signal s2 and the clock signal b1. In the case where a logical value of the power signal s2 is "1", a logical value of the control signal k5 may be determined based on a logical value of the clock signal b1. For example, in the case where the clock signal b1 has a value of logic "1", the control signal k5 may have a value of logic "0". In the case where the clock signal b1 has a value of logic "0", the control signal k5 may have a value of logic "1".

Figure 15:
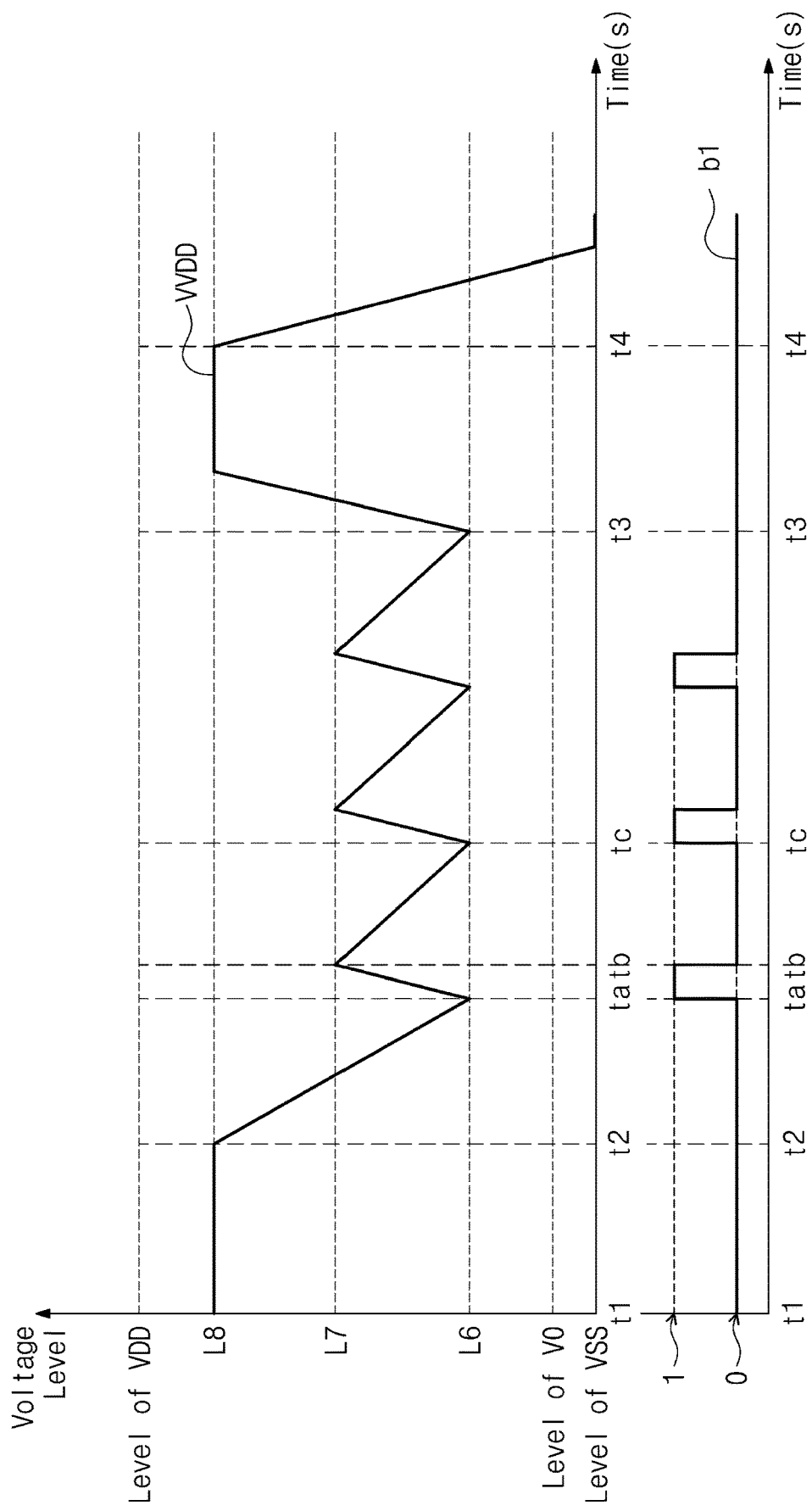
FIG. 15 is a graph illustrating a level of an example operation voltage according to an operation state of a logic block in a power gating circuit of FIG. 14.

FIG. 15 is a graph illustrating a level of an operation voltage according to an operation state of a logic block in a power gating circuit of FIG. 14. For better understanding, FIG. 14 will be referenced together.

In the case where the logic block 1100 is in the full operation state or in the non-operation state, the power gating circuit 1000*e* disclosed in FIG. 14 may provide operations corresponding to the operations of the power gating circuit 1000*a* disclosed in FIG. 3. In the case where the logic block 1100 is in the full operation state, a level L8 of the operation voltage VVDD disclosed in FIG. 15 may correspond to the level L2 of the operation voltage VVDD disclosed in FIG. 4.

Between the time "t2" and the time "t3", the power signal s2 may have a value of logic "1". The clock generator 1710 may output the clock signal b1 based on the power signal s2.

Between the time "t2" and the time "ta", the clock signal b1 may have a value of logic "0". The control signal k5 may have a value of logic "1" based on the clock signal b1. The dedicated switch 1310 may disconnect the operation voltage line 1920 from the power supply voltage line 1910 based on the control signal k5. Accordingly, the level of the operation voltage VVDD may be decreased from the level L8 to the level L6.

Between the time "ta" and the time "tb", the clock signal b1 may have a value of logic "1". The control signal k5 may have a value of logic "0" based on the clock signal b1. The dedicated switch 1310 may connect the operation voltage line 1920 to the power supply voltage line 1910 based on the control signal k5. Accordingly, the level of the operation voltage VVDD may be increased from the level L6 to a level L7.

Between the time "tb" and the time "tc", the clock signal b1 may have a value of logic "0". The control signal k5 may have a value of logic "1" based on the clock signal b1. The dedicated switch 1310 may disconnect the operation voltage line 1920 from the power supply voltage line 1910 based on the control signal k5. Accordingly, the level of the operation voltage VVDD may be decreased from the level L7 to a level L6.

The clock generator 1710 may control a period of the clock signal b1 and a time length between time "ta" and the time "t2" such that the level L6 is higher than the level of the loss voltage V0. Also, the clock generator 1710 may control a period of the clock signal b1 and a time length between time "ta" and the time "t2" such that the level L7 is lower than the level L8.

The period of the clock signal b1 may be "tc-ta". Until the time "t3", the clock generator 1710 may repeatedly output the clock signal b1 having the same waveform as a waveform of the clock signal b1 generated between the time "ta" and the time "tc". Based on the clock signal b1, between the time "ta" and the time "t3", an operation where the level of the operation voltage VVDD is decreased to the level L6 and an operation where the level of the operation voltage VVDD is increased to the level L7 may be repeated. Accordingly, in the case where a length of the period of the clock signal b1 increases, a level difference of the level L6 and the level L7 may become greater.

The clock generator 1710 may control the time "ta" at which the clock signal b1 having a value of logic "1" starts to be output. The level of the operation voltage VVDD which is maintained between the time "ta" and the time "t3" may be changed depending on a time length between the time "t2" and the time "ta". For example, as the time length between the time "t2" and the time "ta" increases, the level of the operation voltage VVDD at the time "ta" may be lower than the level L6. In this case, the level of the operation voltage VVDD may be maintained between a level lower than the level L6 and a level lower than the level L7.

As described with reference to FIG. 3, the control circuit 1400*a* may receive the operation voltage VVDD for the purpose of outputting the control signal k1. In contrast, the control circuit 1700 illustrated in FIG. 14 may output the control signal k5 without receiving the operation voltage VVDD.

While the logic block 1100 is in the maintaining state, the power gating circuit 1000*a* may allow the level of the operation voltage VVDD to be maintained at substantially the same level as the first reference level L1. The first reference level L1 may be determined based on a type of the first gate 1410*a*. In contrast, while the logic block 1100 is in the maintaining state, the power gating circuit 1000*e* may allow the level of the operation voltage VVDD to be maintained between the level L6 and the level L7. The level L6 and the level L7 may be determined based on a length of the period of the clock signal b1 and the time length between the time "t2" and the time "ta".

To maintain the level of the operation voltage VVDD at substantially one voltage level L1, the dedicated switch 1310 of FIG. 3 should repeat a switching operation without a pause. The period of the switching operation generated in the dedicated switch 1310 illustrated in FIG. 14 may coincide with the period of the clock signal b1. The clock generator 1710 may control the period of the clock signal b1. Accordingly, the power consumption of the dedicated switch 1310 illustrated in FIG. 14 may be smaller than the power consumption of the dedicated switch 1310 illustrated in FIG. 3.

Figure 16:
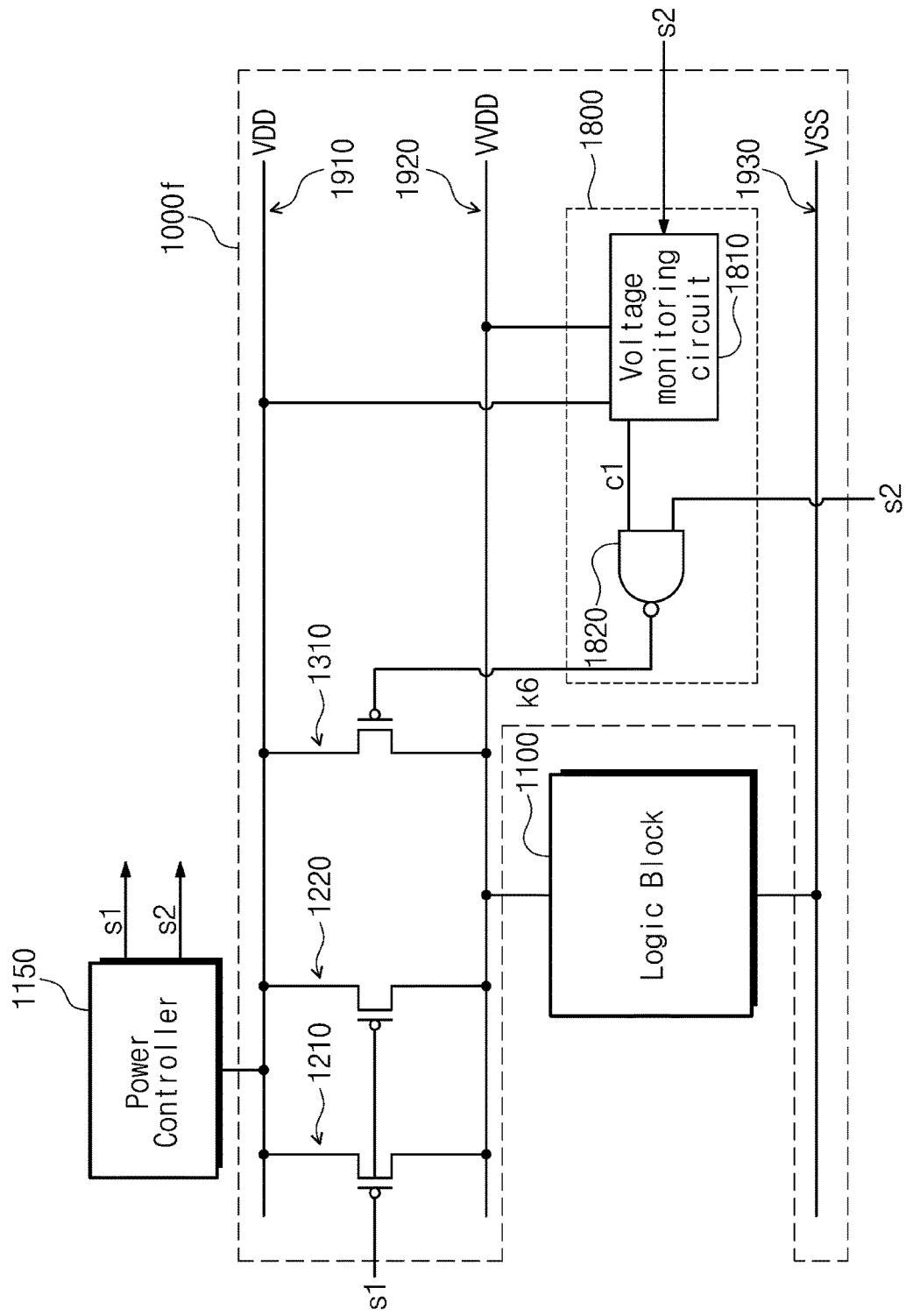
FIG. 16 is a circuit diagram illustrating an example configuration of a power gating circuit of FIG. 2.

FIG. 16 is a circuit diagram illustrating an example configuration of a power gating circuit of FIG. 2.

Components 1210, 1220, 1310, and 1820 of a power gating circuit 1000f illustrated in FIG. 16 may provide configurations and operations corresponding to the components 1210, 1220, 1310, and 1420a of the power gating circuit 1000a of FIG. 3. Thus, additional description will be omitted to avoid redundancy.

A control circuit 1800 may include a voltage monitoring circuit 1810 and a first gate 1820.

The voltage monitoring circuit 1810 may be supplied with the power supply voltage VDD from the power supply voltage line 1910. The voltage monitoring circuit 1810 may receive the power signal s2. The voltage monitoring circuit 1810 may operate based on the supplied power supply voltage VDD and the power signal s2. The power signal s2 may have a value of logic "1" when the logic block 1100 is in the maintaining state. The voltage monitoring circuit 1810 may output a signal c1 when a logical value of the power signal s2 is "1".

The voltage monitoring circuit 1810 may receive the operation voltage VVDD. The voltage monitoring circuit 1810 may output a conversion value corresponding to the level of the operation voltage VVDD. The voltage monitoring circuit 1810 may use one or more reference values. Information about the one or more reference values may be stored to the voltage monitoring circuit 1810 or may be stored to any other memory element. The one or more reference values may correspond to levels of a voltage, respectively.

The voltage monitoring circuit 1810 may compare the conversion value with the one or more reference values. The voltage monitoring circuit 1810 may output the signal c1 based on a result of the comparison. An operation of outputting the signal c1 based on the comparison result will be described with reference to FIG. 17. In the case where the logic block 1100 is in the maintaining state, the level of the operation voltage VVDD may be associated with the voltage levels corresponding to the one or more reference values.

The first gate 1820 may output a control signal k6 based on the power signal s2 and the signal c1. In the case where a logical value of the power signal s2 is "1", a logical value of the control signal k6 may be determined based on a logical value of the signal c1. For example, in the case where the signal c1 has a value of logic "1", the control signal k6 may have a value of logic "0". In the case where the signal c1 has a value of logic "0", the control signal k6 may have a value of logic "1".

Figure 17:
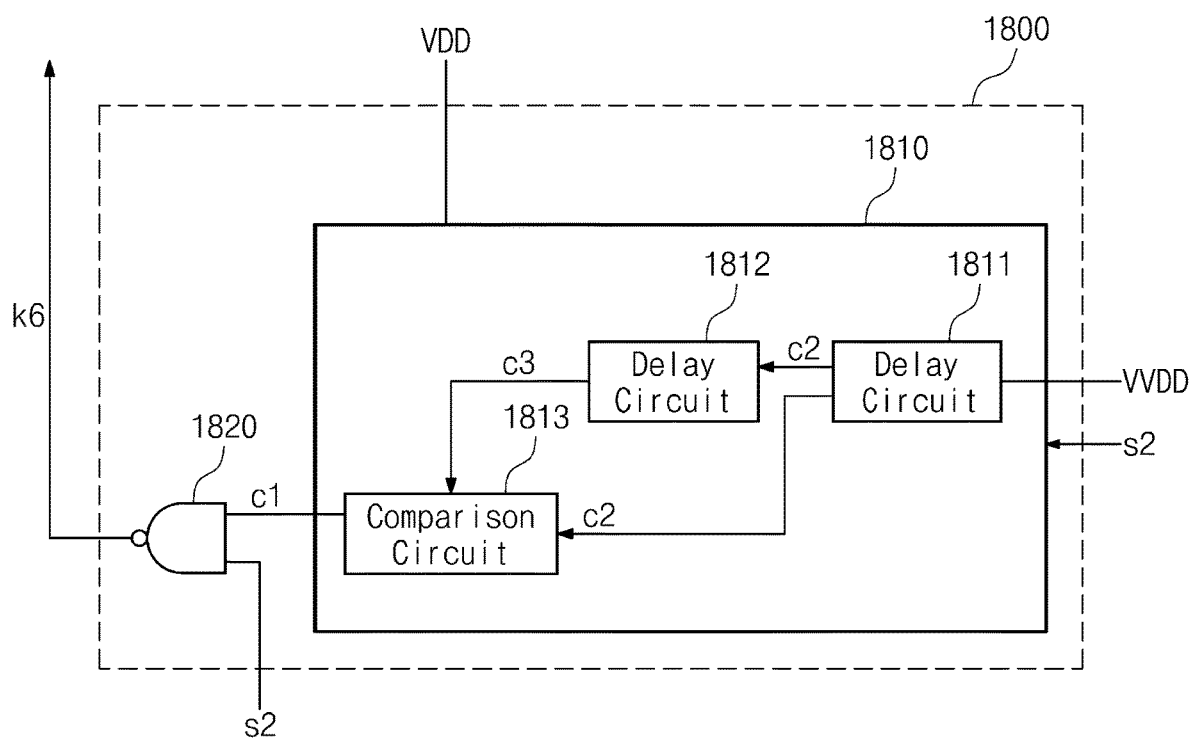
FIG. 17 is a circuit diagram illustrating an example configuration of a control circuit of FIG. 16.

FIG. 17 is a circuit diagram illustrating an example configuration of a control circuit of FIG. 16.

The control circuit 1800 may include the voltage monitoring circuit 1810 and the first gate 1820. The voltage monitoring circuit 1810 may include delay circuits 1811 and 1812 and a comparison circuit 1813. The inventive concepts are not limited to the case where the voltage monitoring circuit 1810 includes two delay circuits 1811 and 1812. For example, the voltage monitoring circuit 1810 may include one or more delay circuits. The voltage monitoring circuit 1810 may operate based on the power signal s2 only while the logic block 1100 is in the maintaining state. Accordingly, an operation of the control circuit 1800 while the logic block 1100 is in the maintaining state will be described below.

The delay circuit 1811 may receive the operation voltage VVDD. The delay circuit 1811 may output a signal c2 based on the level of the operation voltage VVDD. The signal c2 may selectively have a value of logic "0" or a value of logic "1".

The delay circuit 1811 may output the signal c2 having a value of logic "0" when the level of the operation voltage VVDD is higher than a sixth reference level. For example, the delay circuit 1811 may include an inverter. The sixth reference level may correspond to the first reference level described with reference to FIG. 3.

A first delay may be generated in the delay circuit 1811. The first delay may be a difference between a time at which the delay circuit 1811 receives the operation voltage VVDD and a time at which the delay circuit 1811 outputs the signal c2. Due to the first delay, the delay circuit 1811 may output the signal having a value of logic "1" at a time at which the operation voltage VVDD having a higher level than the sixth reference level is received. The first delay may become longer as the level of the operation voltage VVDD becomes higher. A logical value of the signal c2 may be determined based on the level of the operation voltage VVDD and the first delay.

The delay circuit 1812 may receive the signal c2. The delay circuit 1812 may output a signal c3 based on the signal c2. The signal c3 may selectively have a value of logic "0" or a value of logic "1".

For example, the delay circuit 1812 may include an inverter. The delay circuit 1812 may output the signal c3 having a value of logic "1" when receiving the signal c2 having a value of logic "0".

A second delay may be generated in the delay circuit 1812. The second delay may be a difference between a time at which the delay circuit 1812 receives the signal c2 and a time at which the delay circuit 1812 outputs the signal c3. Due to the second delay, the delay circuit 1812 may output the signal c3 having a value of logic "0" at a time at which the signal c2 having a value of logic "0" is received. A logical value of the signal c3 may be determined based on the level of the operation voltage VVDD and the second delay.

The comparison circuit 1813 may receive the signals c2 and c3. The comparison circuit 1813 may generate a conversion value corresponding to the signals c2 and c3. For example, in the case where the signal c2 and the signal c3 have a value of logic "1" and a value of logic "0", respectively, the conversion value may be "10". Since the conversion value is determined based on logical values of the signals c2 and c3, the conversion value may be a value associated with the level of the operation voltage VVDD, the first delay, and the second delay. The conversion value may include information about the level of the operation voltage VVDD.

The comparison circuit 1813 may use one or more reference values. One reference value may include information corresponding to one voltage level. The comparison circuit 1813 may compare the conversion value with the one or more reference values. The comparison circuit 1813 may output a signal c1 based on a result of the comparison.

For example, the comparison circuit 1813 may store a first reference value, a second reference value, and a third reference value. "11" being the first reference value may correspond to a first voltage level, "01" being the second reference value may correspond to a second voltage level, and "00" being the third reference value may correspond to a third voltage level. The first voltage level may be lower than the second voltage level, and the second voltage level may be lower than the third voltage level.

For example, the comparison circuit 1813 may compare the first reference value, the third reference value, and the conversion value. The comparison circuit 1813 may output the signal c1 having a value of logic "0" when the conversion value is the third reference value. The comparison circuit 1813 may output the signal c1 having a value of logic "0" until the conversion value goes to the first reference value. The comparison circuit 1813 may output the signal c1 having a value of logic "1" when the conversion value is the first reference value. The comparison circuit 1813 may output the signal c1 having a value of logic "1" until the conversion value goes to the third reference value.

Accordingly, the level of the operation voltage VVDD of the power gating circuit 1000*f* may correspond to the level of the operation voltage VVDD of the power gating circuit 1000*d* described with reference to FIG. 11. The first voltage level and the third voltage level may respectively correspond to the fourth reference level and the fifth reference level, which are described with reference to FIG. 11.

In the example embodiments of the present disclosure, the power gating circuit 1000 may control a level of an operation voltage without receiving any other voltage except for the power supply voltage VDD, the operation voltage VVDD, and the ground voltage VSS. Also, as the control circuit 1400 may be implemented with a digital circuit, the area of the power gating circuit 1000 may be reduced.

According to an example embodiment of the inventive concepts, while a part of internal components of an electronic device does not operate, a power gating circuit may control a level of an operation voltage. The power gating circuit may decrease the level of the operation voltage to a level enough for a logic block to retain the stored data.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A power gating circuit comprising:
a first switch circuit configured to disconnect a first voltage line from a second voltage line while a logic block connected to the first voltage line is in a first operation state;
a gate circuit configured to output a control signal having a first logical value in response to a level of a first voltage on the first voltage line being lower than a reference level while the logic block is in the first operation state; and
a second switch circuit configured to connect the first voltage line to the second voltage line based on the first logical value of the control signal,
wherein the gate circuit comprises:
a first logic gate configured to output a first signal in response to the level of the first voltage on the first voltage line being lower than the reference level; and
a first NAND gate configured to receive the first signal from the first logic gate and to output the control signal having the first logical value based on the first signal while the logic block is in the first operation state; and wherein
the first logic gate is one of an inverter, a NAND gate, and a NOR gate, and
the reference level is based on a type of the first logic gate.

2. The power gating circuit of claim 1, wherein each of the first switch circuit and the second switch circuit includes one or more PMOS transistors; source terminals of the one or more PMOS transistors are connected to the second voltage line; and
drain terminals of the one or more PMOS transistors are connected to the first voltage line.

3. The power gating circuit of claim 1, wherein the gate circuit is configured such that the reference level changes based on the type of the first logic gate and a level of a second voltage on the second voltage line.

4. The power gating circuit of claim 1, wherein
the gate circuit is further configured to
output the control signal having a second logical value different from the first logical value in response to the level of the first voltage being higher than the reference level while the logic block is in the first operation state; and
wherein the second switch circuit is further configured to disconnect the first voltage line from the second voltage line based on the second logical value of the control signal.

5. The power gating circuit of claim 1, further comprising:
a power controller configured to generate a power signal associated with an operation state of the logic block such that the logic block is in the first operation state or a second operation state.

6. The power gating circuit of claim 5, wherein
the first switch circuit is further configured to connect the first voltage line to the second voltage line based on the power signal while the logic block is in the second operation state;
the gate circuit is further configured to output the control signal having a second logical value different from the first logical value based on the power signal while the logic block is in the second operation state; and
the second switch circuit is further configured to disconnect the first voltage line from the second voltage line based on the second logical value of the control signal.

7. The power gating circuit of claim 5, wherein
the level of the first voltage is lower than a level of a second voltage on the second voltage line;
in the first operation state, the logic block is configured to retain stored data without a data input and output; and
in the second operation state, the logic block is configured to operate such that data are input and output.

8. A power gating circuit comprising:
a gate circuit configured to output a control signal selectively having a first logical value or a second logical value based on (i) a level of a first voltage on a first voltage line connected to a logic block, and (ii) a first reference level, in a first mode; and
a first switch circuit configured to disconnect the first voltage line from a second voltage line based on the first logical value of the control signal, and connect the first voltage line to the second voltage line based on the second logical value of the control signal, in the first mode,
wherein the gate circuit comprises:
a first logic gate configured to output a first signal based on the level of the first voltage and the first reference level, and
a first NAND gate configured to receive the first signal from the first logic gate and to selectively output the control signal of the first logical value or the control signal of the second logical value based on the first signal; and wherein
the first logic gate is one of an inverter, a NAND gate, and a NOR gate, and the gate circuit is configured such that the first reference level changes based on a type of the first logic gate included in the gate circuit and a level of a second voltage on the second voltage line.

9. The power gating circuit of claim 8, wherein the gate circuit is further configured to:
   output the control signal of the first logical value in response to the level of the first voltage being higher than the first reference level in the first mode; and
   output the control signal of the second logical value in response to the level of the first voltage being lower than the first reference level in the first mode.

10. The power gating circuit of claim 8, further comprising:
    a second switch circuit between the first voltage line and the second voltage line; and
    wherein the second switch circuit is configured to
       disconnect the first voltage line from the second voltage line in the first mode, and
       connect the first voltage line to the second voltage line in response to the logic block being in a second mode different from the first mode.

11. The power gating circuit of claim 10, wherein the level of the first voltage in the second mode is higher than the level of the first voltage in the first mode.

12. The power gating circuit of claim 8, wherein
    the gate circuit further comprises a second logic gate;
    the first reference level being changed based on a type of the first logic gate and the level of the second voltage;
    the second logic gate is configured to output a second signal based on the level of the first voltage and a second reference level, the second reference level being changed based on a type of the second logic gate and the level of the second voltage; and
    the gate circuit is further configured to selectively output the control signal of the first logical value or the control signal of the second logical value based on the first signal and the second signal.

13. The power gating circuit of claim 12, wherein, in response to the first reference level being lower than the second reference level in the first mode, the gate circuit is further configured to:
    output the control signal of the second logical value in response to the level of the first voltage being lower than the first reference level in a first time interval in which the level of the first voltage decreases; and
    output the control signal of the second logical value in response to the level of the first voltage being lower than the second reference level in a second time interval in which the level of the first voltage increases.

14. The power gating circuit of claim 13, wherein, in the first mode, the first switch circuit is configured to:
    disconnect the first voltage line from the second voltage line until the level of the first voltage goes to the first reference level; and
    connect the first voltage line to the second voltage line until the level of the first voltage goes to the second reference level.

15. A power gating circuit comprising:
    a control circuit configured to output a control signal without receiving any other voltage except for a first voltage, a second voltage and a third voltage, the first voltage being from a first voltage line connected to a logic block, the second voltage being from a second voltage line, the second voltage having a lower level than a level of the first voltage, the third voltage being from a third voltage line, the third voltage having a higher level than the level of the first voltage; and
    a switch circuit configured to connect the first voltage line to the third voltage line or disconnect the first voltage line from the third voltage line, based on the control signal, such that the level of the first voltage is higher than a first reference level, while the logic block is in a maintaining state, the first reference level based on a type of a first logic gate included in the control circuit,
       wherein the logic block is further configured to retain data stored in the logic block without a data input and output, based on the level of the first voltage, which is higher than the first reference level in the maintaining state,
    wherein the control circuit comprises:
       the first logic gate configured to output a first signal by comparing the level of the first voltage on the first voltage line and the first reference level; and
       a first NAND gate configured to receive the first signal from the first logic gate and to output the control signal based on the first signal; and
    wherein the first logic gate is one of an inverter, a NAND gate, and a NOR gate.

16. The power gating circuit of claim 15, wherein
    the control circuit comprises a clock generator configured to output a clock signal, and
    a length of a period of the clock signal is associated with the level of the first voltage in response to the logic block being in the maintaining state.

17. The power gating circuit of claim 16, wherein the control circuit is configured to output the control signal based on the clock signal.

18. The power gating circuit of claim 15, wherein
    the control circuit comprises a monitoring circuit, and
    the monitoring circuit is configured to output the control signal based on a comparison result of comparing a conversion value corresponding to the level of the first voltage and one or more reference values.

19. The power gating circuit of claim 18, wherein
    the one or more reference values include a first reference value and a second reference value greater than the first reference value, and
    wherein the control circuit is further configured to,
       output the control signal selectively having a first logical value or a second logical value based on the comparison result;
       output the control signal of the first logical value until the conversion value goes to the second reference value; and
       output the control signal of the second logical value until the conversion value goes to the first reference value.

20. The power gating circuit of claim 18, wherein
    the monitoring circuit further comprises a logic gate configured to output an output voltage based on the level of the first voltage,
    the conversion value is associated with a delay according to the level of the first voltage, and
    the delay corresponds to a time length between a time at which the logic gate receives the first voltage and a time at which the logic gate outputs the output voltage.

* * * * *